United States Patent
Keith et al.

(10) Patent No.: US 7,385,141 B2
(45) Date of Patent: Jun. 10, 2008

(54) DOOR ASSEMBLIES AND COMMUNICATIONS CABLE MANAGEMENT SYSTEMS INCLUDING THE SAME

(75) Inventors: Scott Martin Keith, Plano, TX (US); Golam Mabud Choudhury, Warren, NJ (US); Gus Arthur Checketts, Elkhorn, NE (US); Chin Choi-Feng, Dallas, TX (US); Theodore Alan Conorich, Lake Hiawatha, NJ (US); Tim Cronin, Austin, TX (US); John Lapetina, San Francisco, CA (US); Roy Riccomini, Saratoga, CA (US); Andy Logan, Redwood City, CA (US); Cormac Eubanks, San Francisco, CA (US); Mike Krynock, Sunnyvale, CA (US); William Alexander Millie, San Francisco, CA (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

(21) Appl. No.: 11/668,885

(22) Filed: Jan. 30, 2007

(65) Prior Publication Data
US 2007/0175654 A1 Aug. 2, 2007

Related U.S. Application Data

(60) Provisional application No. 60/840,604, filed on Aug. 28, 2006, provisional application No. 60/763,876, filed on Jan. 31, 2006.

(51) Int. Cl.
*H02G 3/04* (2006.01)
(52) U.S. Cl. .................. 174/135; 174/50; 174/60; 385/135; 361/823

(58) Field of Classification Search ............... 174/50, 174/135, 150, 157, 60, 61, 63, 58; 385/135, 385/137, 136, 134; 361/823, 827; 138/156; 220/3.2, 4.02; 439/404, 625; 211/26, 169
See application file for complete search history.

(56) References Cited

U.S. PATENT DOCUMENTS 2,896,009 A * 7/1959 Caveney ............... 174/72 A (Continued)

OTHER PUBLICATIONS

International Search Report and the Written Opinion of the International Searching Authority for PCT Application No. PCT/US07/02652, mailed Nov. 19, 2007.

(Continued)

*Primary Examiner*—Dhiru R Patel
(74) *Attorney, Agent, or Firm*—Myers Bigel Sibley & Sajovec, P.A.

(57) ABSTRACT

A communications cable management system includes a support structure and a door assembly. The door assembly includes at least two first latch structures and at least two second latch structures each selectively positionable in a latched position to secure the door body to the support structure. First and second actuators are operable by a user to selectively latch the latch structures such that a door body is secured in a closed position on the support structure, the door body can be removed from the support structure, the door body can be pivoted open about the first pivot axis, or the door body can be pivoted open about a second pivot axis.

22 Claims, 17 Drawing Sheets

U.S. PATENT DOCUMENTS 3,515,086 A * 6/1970 Sigman et al. ............... 114/260
5,546,495 A * 8/1996 Bruckner et al. ........... 385/135
6,011,221 A * 1/2000 Lecinski et al. .......... 174/72 A
6,118,075 A   9/2000 Baker et al.
6,504,094 B2 * 1/2003 Woo et al. .................... 174/50
7,194,181 B2 * 3/2007 Holmberg et al. .......... 385/135
2006/0237377 A1 * 10/2006 Smith et al. .................. 211/26

OTHER PUBLICATIONS

Chatsworth Products, Inc., *MCS—EFX Master Cabling Section Extended Fingers*, 2004, 2 pages.

Photographs of Chatsworth Products, Inc. MCS-EFX Master Cabling Section, 5 pages.

* cited by examiner

DOOR ASSEMBLIES AND COMMUNICATIONS CABLE MANAGEMENT SYSTEMS INCLUDING THE SAME

RELATED APPLICATION(S)

The present application claims the benefit of priority from U.S. Provisional Patent Application Ser. No. 60/763,876, filed Jan. 31, 2006, and U.S. Provisional Patent Application Ser. No. 60/840,604, filed Aug. 28, 2006, the disclosures of which are incorporated herein by reference in their entireties.

FIELD OF THE INVENTION

The present invention relates to communications devices and methods and, more particularly, to communications cable management systems and methods for managing communications cables and/or connections.

BACKGROUND OF THE INVENTION

Communications cable management systems are commonly used to route, arrange and manage connections with communications cables. Such communications cable management systems may include communications racks, cabinets or wall-mounted systems (such as terminal block panels and spacer brackets). Terminal block panels (which may also be referred to as patch panels, back panels, or cross-connects) are hardware devices used in the communication equipment industry to connect cables to terminal equipment contained within an environment (e.g., office suites, apartment buildings, etc.). The panels are typically available to accommodate 900 wire pair and 300 wire pair configurations and are often mounted to a wall situated within a closet in the equipment environment. Exemplary panels contain a securing surface that is affixed or fastened to the wall, and a mounting surface configured into a plurality of tangs upon which connecting devices such as connecting blocks are secured. The connecting blocks interface with data carrying cables, such as exterior cables that route data to and from the environment, to cables connected to, for example, terminal devices.

In some cases, two or more back panels are mounted in side-by-side, spaced apart arrangement. A spacer bracket is mounted in the space between the back panels. The spacer bracket may be secured to the wall and/or one or both of the back panels. The spacer bracket defines a cord trough through which cords may be routed for connecting connection blocks of one of the back panels with connection blocks of the other back panel. In some cases, a door panel is mounted on the spacer bracket to protect and hide the cords in the cord trough. According to one known construction available from Chatsworth Products, Inc., the door panel is secured to the spacer bracket by four plastic quarter turn fasteners located along each side edge of the door panel. The door panel can be removed by releasing (i.e., by turning to an open position) all four fasteners. Alternatively, the user may release the two fasteners on either side, and pivot the door panel about the other two plastic fasteners.

SUMMARY OF THE INVENTION

According to embodiments of the present invention, a communications cable management system includes a support structure and a door assembly. The support structure defines a cable trough and includes at least two first mount structures and at least two second mount structures spaced apart from the at least two first mount structures. The door assembly includes a door body, first and second latch mechanisms, and first and second actuators. The door body has first and second opposed side edges. The first latch mechanism includes at least two first latch structures each selectively positionable between a latched position, wherein the first latch structure engages a respective one of the first mount structures to secure the door body to the support structure for pivotal movement therebetween about a first pivot axis proximate the first side edge of the door body, and an unlatched position, wherein the first latch structure is disengaged from the first mount structure to permit the first side edge of the door to be separated from the support structure. The second latch mechanism includes at least two second latch structures each selectively positionable between a latched position, wherein the second latch structure engages a respective one of the second mount structures to secure the door body to the support structure for pivotal movement therebetween about a second pivot axis proximate the second side edge of the door body, and an unlatched position, wherein the second latch structure is disengaged from the second mount structure to permit the second side edge of the door to be separated from the support structure. The first actuator is operable by a user to selectively move each of the first latch structures as a group from their latched positions to their unlatched positions. The second actuator is operable by a user to selectively move each of the second latch structures as a group from their latched positions to their unlatched positions. When the first and second latch structures are in their latched positions, the door body is secured in a closed position on the support structure. When the first and second latch structures are in their unlatched positions, the door body can be removed from the support structure. When the first latch structures are in their latched positions and the second latch structures are in their unlatched positions, the door body can be pivoted open about the first pivot axis. When the second latch structures are in their latched positions and the first latch structures are in their unlatched positions, the door body can be pivoted open about the second pivot axis.

According to some embodiments of the present invention, a door assembly for a communications cable management system including a support structure defining a cable and including at least two first mount structures and at least two second mount structures spaced apart from the at least two first mount structures is provided. The door assembly includes a door body, first and second latch mechanisms, and first and second actuators. The door body has first and second opposed side edges. The first latch mechanism includes at least two first latch structures each selectively positionable between a latched position, wherein the first latch structure engages a respective one of the first mount structures to secure the door body to the support structure for pivotal movement therebetween about a first pivot axis proximate the first side edge of the door body, and an unlatched position, wherein the first latch structure is disengaged from the first mount structure to permit the first side edge of the door to be separated from the support structure. The second latch mechanism includes at least two second latch structures each selectively positionable between a latched position, wherein the second latch structure engages a respective one of the second mount structures to secure the door body to the support structure for pivotal movement therebetween about a second pivot axis proximate the second side edge of the door body, and an unlatched position, wherein the second latch structure is disengaged from the second mount structure to permit the second side edge of the door to be separated from the support structure. The first actuator is operable by a user to selectively move each of the first latch structures as a group from their latched positions to their unlatched positions. The second actuator is operable by a user to selectively move each of the second latch structures as a group from their latched positions to their unlatched positions. When the first and second latch structures are in their latched positions, the door body is secured in a closed position on the support structure. When the first and second latch structures are in their unlatched positions, the door body can be removed from the support structure. When the first latch structures are in their latched positions and the second latch structures are in their unlatched positions, the door body can be pivoted open about the first pivot axis. When the second latch structures are in their latched positions and the first latch structures are in their unlatched positions, the door body can be pivoted open about the second pivot axis.

According to further embodiments of the present invention, a communications cable management system includes a support structure and a door assembly. The support structure defines a cable trough and includes a first mount structure and a second mount structure spaced apart from the first mount structure. The first and second mount structures define first and second pin slots, respectively. The door assembly includes a door body, first and second latch pins, and at least one actuator. The door body has first and second opposed side edges. The first latch pin is selectively positionable between a latched position, wherein the first latch pin engages the first pin slot to secure the door body to the support structure for pivotal movement therebetween about a first pivot axis proximate the first side edge of the door body, and an unlatched position, wherein the first latch pin is disengaged from the first pin slot to permit the first side edge of the door to be separated from the support structure. The second latch pin is selectively positionable between a latched position, wherein the second latch pin engages the second pin slot to secure the door body to the support structure for pivotal movement therebetween about a second pivot axis proximate the second side edge of the door body, and an unlatched position, wherein the second latch pin is disengaged from the second pin slot to permit the second side edge of the door to be separated from the support structure. The at least one actuator is operable to: selectively slide the first latch pin from its latched position to its unlatched position along a first slide axis that is substantially parallel to the first pivot axis; and selectively slide the second latch pin from its latched position to its unlatched position along a second slide axis that is substantially parallel to the second pivot axis.

According to some embodiments of the present invention, a communications cable management system includes a support structure and a door assembly. The support structure defines a cable trough and includes a first mount structure and a second mount structure spaced apart from the first mount structure. The door assembly includes a door body, first and second latch mechanisms, at least one actuator, and an automatic retention mechanism. The door body has first and second opposed side edges. The first latch mechanism includes a first latch structure selectively positionable between a latched position, wherein the first latch structure engages the first mount structure to secure the door body to the support structure for pivotal movement therebetween about a first pivot axis proximate the first side edge of the door body, and an unlatched position, wherein the first latch structure is disengaged from the first mount structure to permit the first side edge of the door to be separated from the support structure. The second latch mechanism includes a second latch structure selectively positionable between a latched position, wherein the second latch structures engages the second mount structure to secure the door body to the support structure for pivotal movement therebetween about a second pivot axis proximate the second side edge of the door body, and an unlatched position, wherein the second latch structure is disengaged from the second mount structure to permit the second side edge of the door to be separated from the support structure. The at least one actuator is operable by a user to selectively move the first and second latch structures from their latched positions to their unlatched positions. The automatic retention mechanism is adapted to automatically hold the first latch structure in its unlatched position when the at least one actuator is operated to move the first latch structure from its latched position to its unlatched position and the first side edge of the door body is separated from the support structure.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

Figure 1:
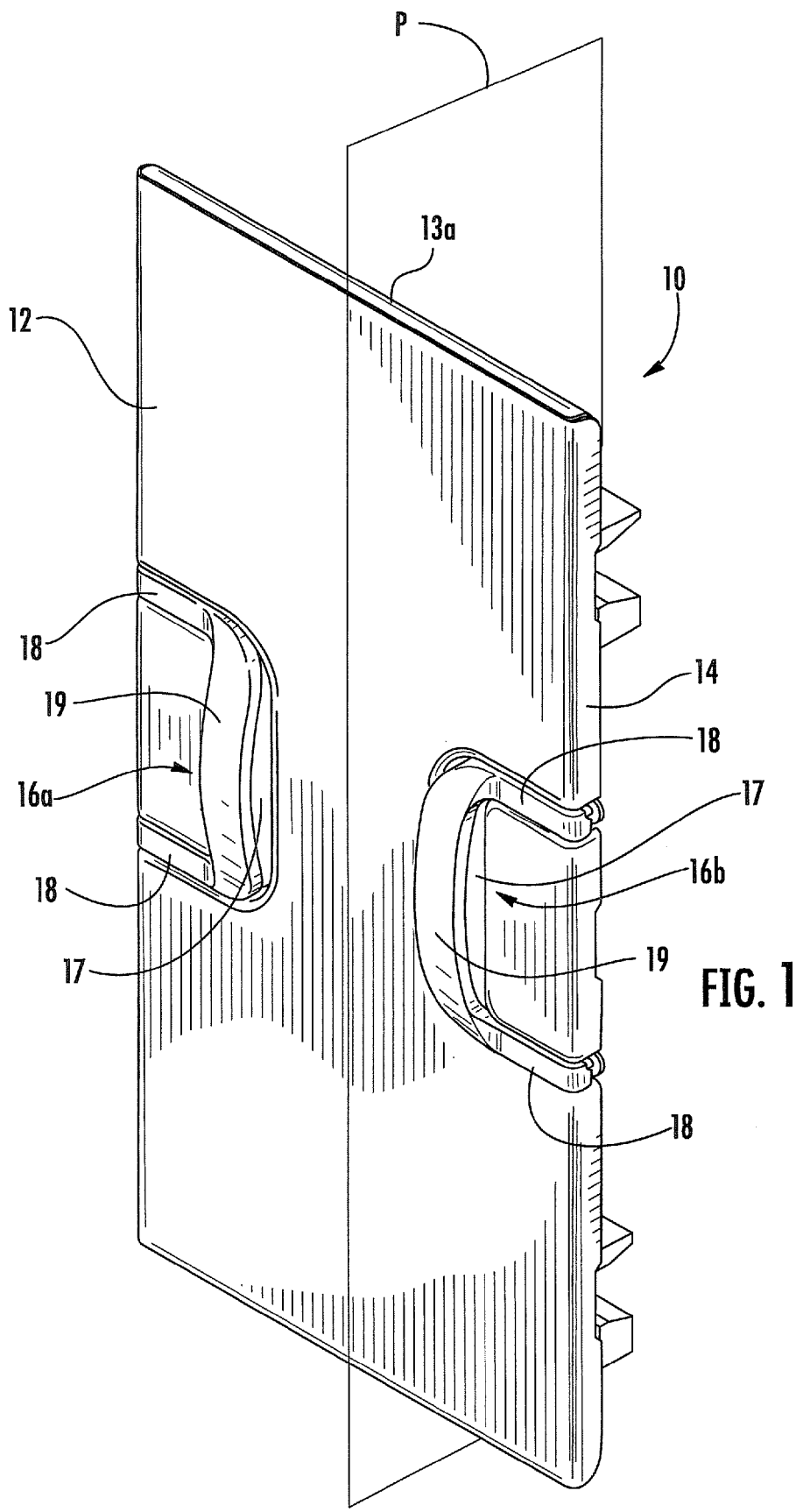
FIG. 1 is a front perspective view of a door assembly for a communications rack, cabinet or wall-mounted system according to embodiments of the present invention.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In accordance with embodiments of the present invention, a door assembly is provided for a communications cable management system. The communications cable management system may include a communications rack, cabinet or wall-mounted system as a support structure upon which the door assembly is mounted. In accordance with further embodiments of the present invention, a communications cable management system including such a door assembly is provided.

Turning now to the figures, a door assembly for a communications rack, cabinet or wall-mounted system, designated broadly at 10, is shown in FIGS. 1-13. Referring first to FIG. 1, the door assembly 10 may include a substantially planar door body or front panel 12 having a top lip 13a, a bottom lip 13b, and side lips 14. Handles 16a, 16b (described in greater detail below) may be attached to the side lips 14 and fit within recesses 17 in the front panel 12.

Referring still to FIG. 1, the handles 16a, 16b may be mirror images of each other about a vertical plane P that is normal to the front panel 12; as such, only one handle 16a will be described below, with the discussion being equally applicable to the other handle 16b. In addition, in referring to the spatial relationships of different components, the terms "lateral", "outer" and derivatives thereof refer to the direction defined by a vector parallel to the front panel 12 that originates at the plane P and extends toward the side lips 14. The terms "inner," "inward" and derivatives thereof refer to the direction that is the opposite of the term "outer"; i.e., the direction defined by a vector originating at a side lip 14 and extending toward the plane P.

The handle 16a may be generally U-shaped, with two arms 18 bridged by a grasping portion 19. In the illustrated embodiment, the grasping portion 19 is bi-arcuate; it protrudes away from the front panel 12 to facilitate grasping by a user, and is curved such that its center is nearer to its adjacent side lip 14 than are its ends. This configuration can also facilitate handling by a user whether the user reaches for the grasping portion 19 from above or below or at a level even with the user.

Figure 2:
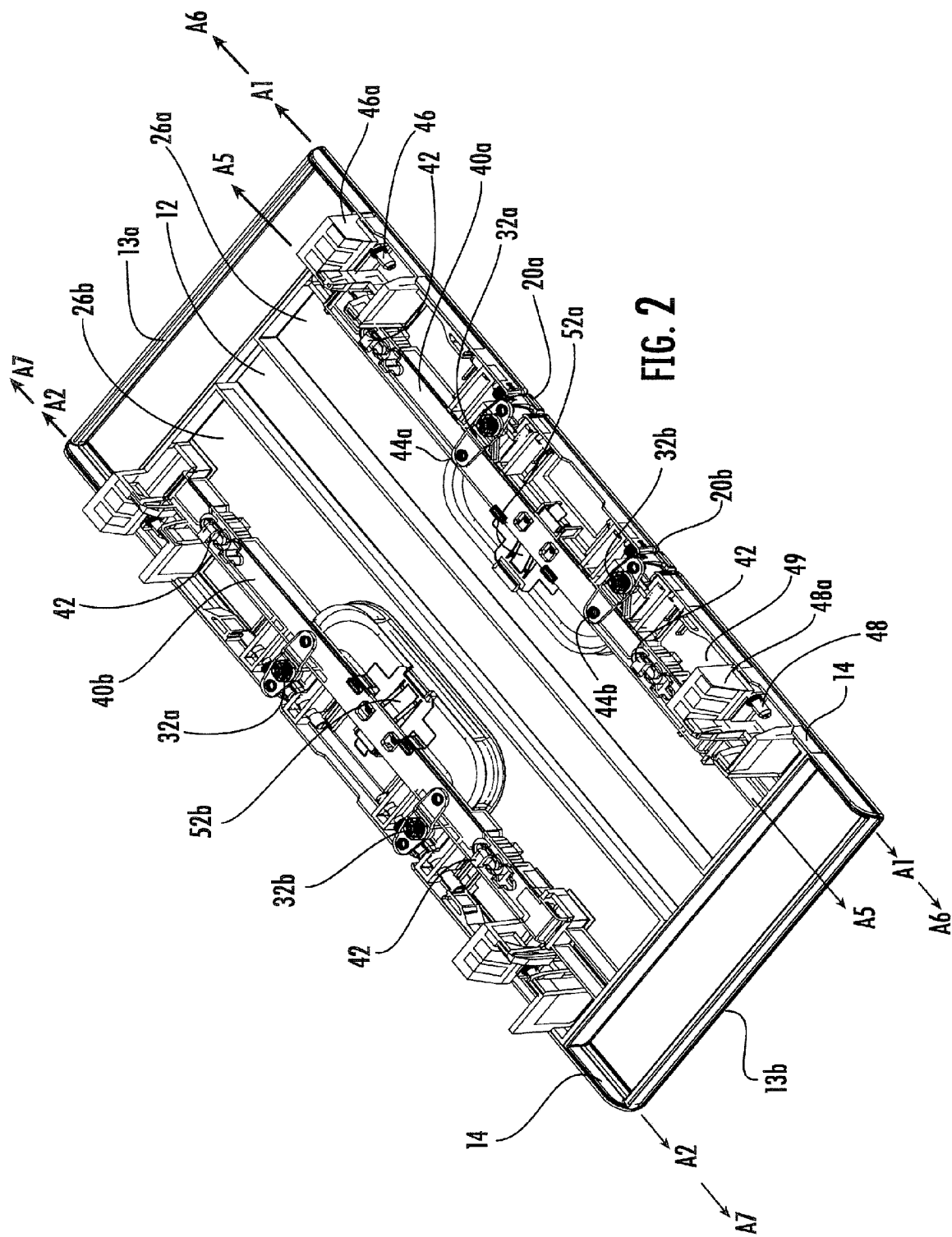
FIG. 2 is a rear perspective view of the door assembly of FIG. 1.
Figure 3:
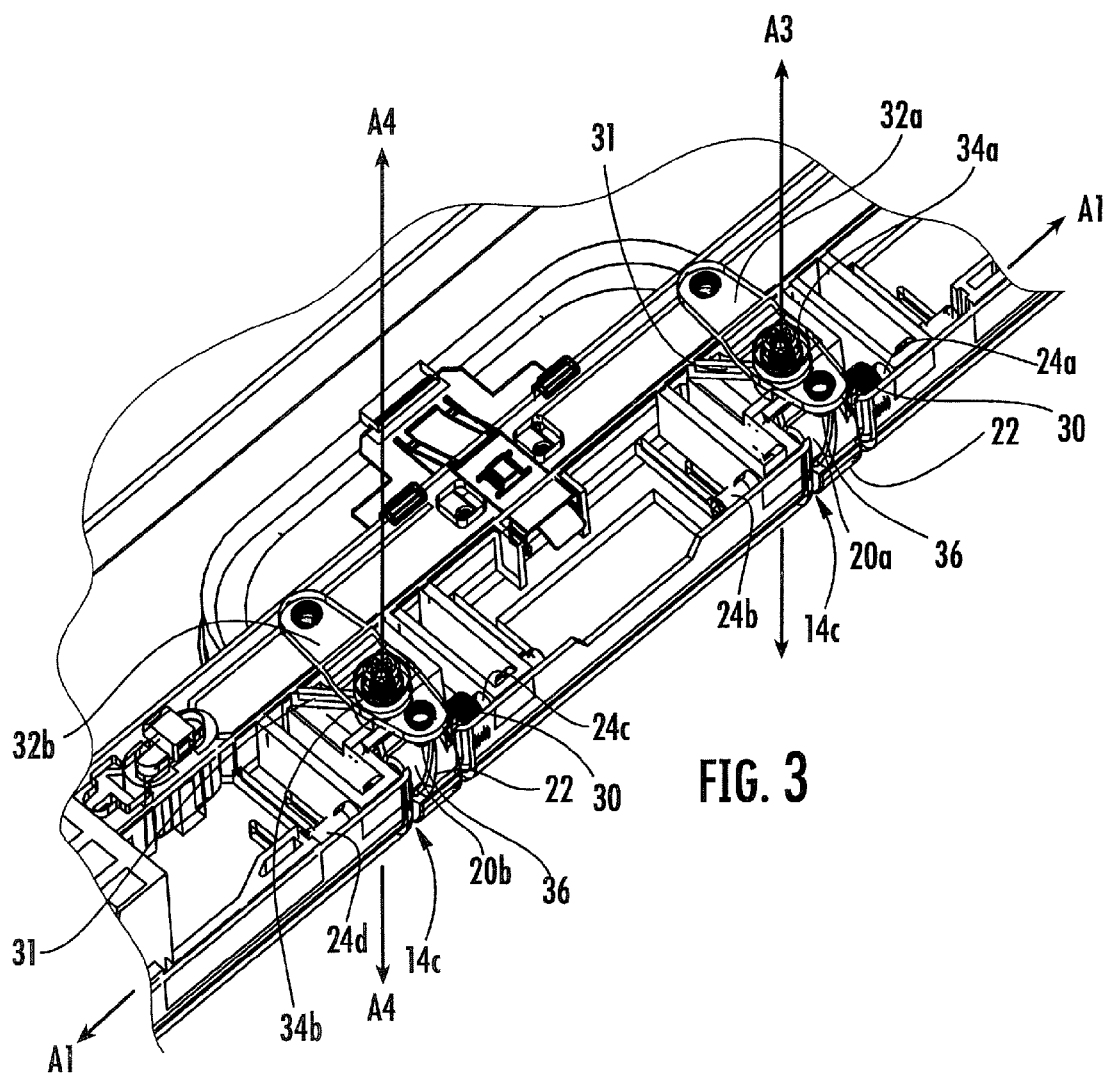
FIG. 3 is an enlarged rear perspective view of the door assembly of FIG. 1 showing the handle and surrounding area.

Turning now to FIGS. 2 and 3, the handle 16a includes a respective pivot base 20a, 20b at the end of each arm 18 located in recesses 14c in the side lips 14. Each pivot base 20a, 20b includes a cammed surface 22 that wraps helically around the pivot base 20a, 20b to form a helical ramp that faces downwardly. Handle pins 24a, 24b extend vertically from opposite ends of the pivot base 20a, and handle pins 24c, 24d extend from opposite ends of the pivot base 20b; together, the handle pins 24a, 24b, 24c, 24d define a door pivot axis A1 (a second pivot axis A2 is defined by the handle pins 24a, 24b, 24c, 24d on the opposite side handle 16b). In the illustrated embodiment, the handle 16a is formed as a unitary member, with the pivot bases 20a, 20b and the handle pins 24a-24d being formed integrally with the remainder of the handle 16a. Those skilled in this art will recognize that the handle may be formed as multiple components.

Figure 4:
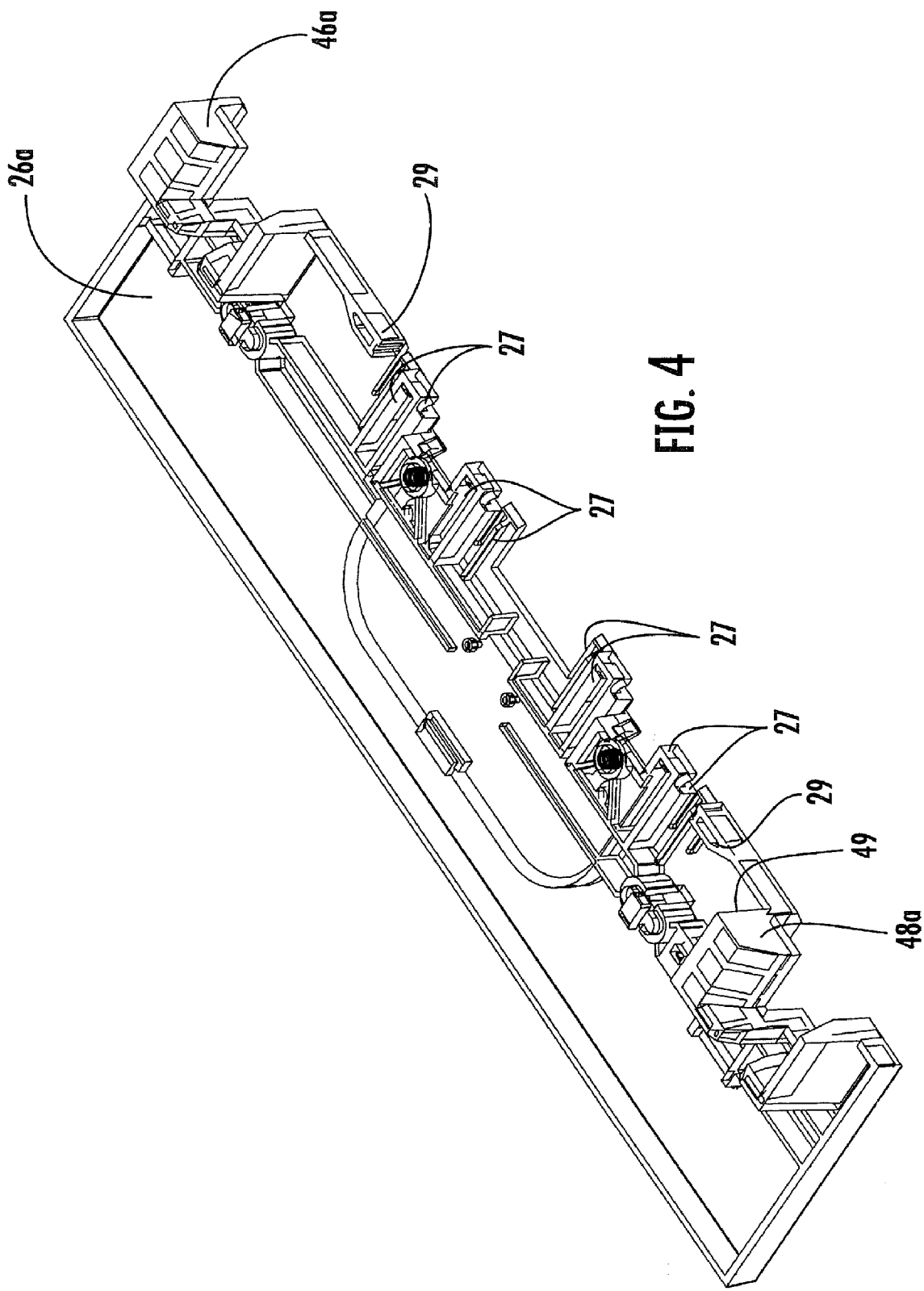
FIG. 4 is a rear perspective view of a backplate of the door assembly of FIG. 1.

Referring now to FIGS. 2 and 4, two mirror image subframes or back plates 26a, 26b (only one of which, the back plate 26a, will be described in detail herein) are mounted adjacent the rear surface of the front panel 12 (typically to the rear surface of the front panel 12 or to the side lips 14). In this embodiment, the back plates 26a, 26b are mounted to the front panel 12 via adhesive, but other mounting techniques, such as threaded fasteners and the like, may also be employed. The back plates 26a, 26b, which can help to provide stiffness to the door assembly 10, are generally planar, but include a number of projections, flanges, bosses, and the like that provide structure for the mounting of other components and/or provide additional function as described below. For example, two bosses (not shown) may extend from the back plates 26a, 26b through holes in the front panel 12 to serve as stops in the recesses 17 against which the handles 16a, 16b can rest. The use of two mirror image back plates 26a, 26b can provide a designer with the flexibility to employ the backer plates 26a, 26b on doors of different widths. It will be appreciated that, in some embodiments, a single back plate may be employed, or the back plates may be omitted entirely.

Referring again to FIGS. 2 and 4, near its lateral edge the back plate 26a includes a series of ribs 27 that have apertures (not shown) that receive the handle pins 24a-24d of the associated handle 16a. Also, two stops 29 are positioned to rest against the ends of the handle pins 24a, 24d to maintain the handle 16a in place. A spring 30 (FIG. 3) surrounds each of the handle pins 24a, 24c and is mounted adjacent a rib 27 to bias the handle 16a toward a closed position, in which the handle 16a resides in the recess 17 of the front panel 12.

Referring back to FIGS. 2 and 3, each of two toggle arms 32a, 32b are pivotally attached to a mounting platform 31 on each back plate 26a, 26b at, respectively, pivots 34a, 34b, such that the toggle arms 32a, 32b can rotate about respective axes A3, A4 that are horizontal and normal to the front panel 12. At its lateral end, each toggle arm 32a, 32b includes a cam interface post 36 that extends toward and contacts the cammed surface 22 of the adjacent pivot base 20a, 20b of the handle 16a.

Figure 5:
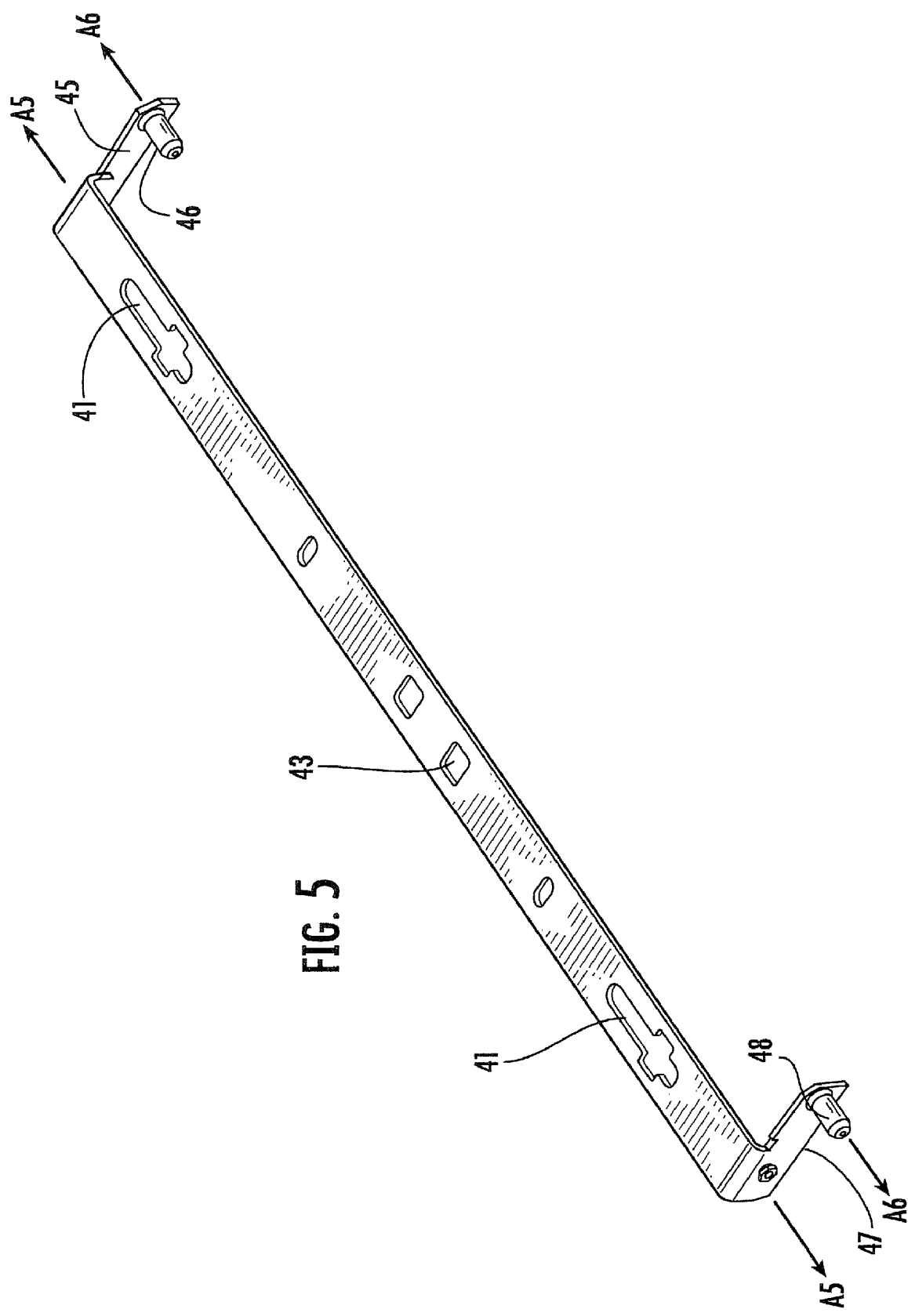
FIG. 5 is a rear perspective view of a latch bar of the door assembly of FIG. 1.

Referring now to FIGS. 2 and 5, first and second latch mechanisms in the form of two generally vertically-disposed mirror image latch bars 40a and 40b (only one of which, latch bar 40a, will be described herein) are positioned inboard of the handles 16a, 16b, each overlying a portion of its respective back plate 26a, 26b. The latch bar 40a includes mounting apertures 41 that receive latch bar retainers 42 that project from the back plate 26a. The mounting apertures 41 are of sufficient length that the latch bar 40a can move vertically over a short distance along an axis AS. The latch bar 40a includes a top flange 45 that extends laterally from the upper end of the latch bar 40a. A latch structure in the form of a latch pin 46 extends downwardly from the top flange 45. The pin 46 is received in an aperture or compartment defined in a locator or guide feature 46a that protrudes from the back plate 26a. Similarly, a bottom flange 47 extends laterally from the lower end of the latch bar 40a, and a latch structure in the form of a pin 48 extends downwardly therefrom through an aperture or compartment in a locator feature 48a that protrudes from the back plate 26a. The pins 46. 48 of the first latch bar 40a serve as first latch structures and the pins 46, 48 of the second latch bar 40b serve as second latch structures. Together the pins 46, 48 define a pivot axis A6 on which the door assembly 10 can pivot (the pins 46, 48 connected to the latch bar 40b define a pivot axis A7 on the opposite side of the door assembly 10). The upper surface of the bottom flange 47 contacts a spring (not shown) that also contacts a rib 49. The spring is in compression and urges the latch bar 40a downwardly. The latch bar 40a also includes a latch stop hole 43 in its central portion. The latch bar 40a is pivotally attached to each of the toggle arms 32a, 32b at respective pivots 44a, 44b.

Figure 6:
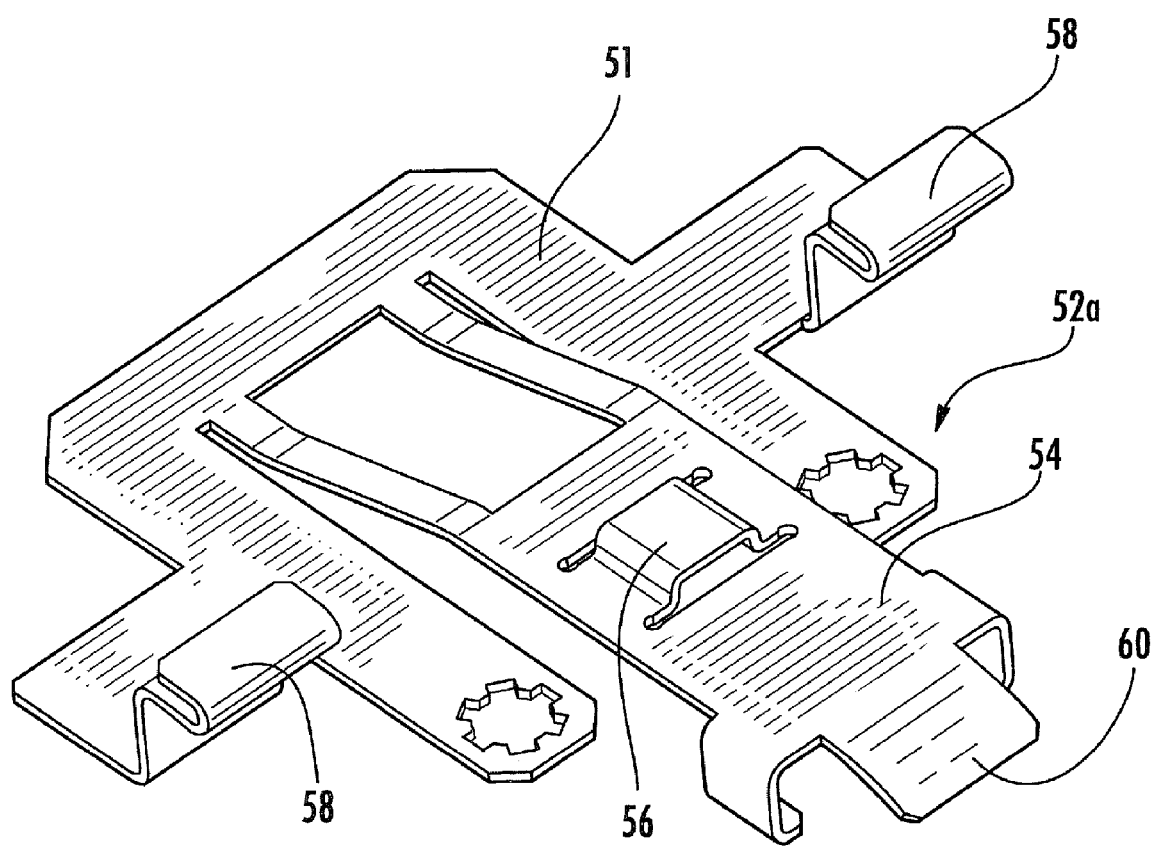
FIG. 6 is a rear perspective view of a latch stop of the door assembly of FIG. 1.

Referring now to FIGS. 2 and 6, two mirror image latch stops 52a, 52b (only one of which, latch stop 52a, will be described herein) are mounted to the rear surfaces of respective back plates 26a, 26b underneath the latch bars 40a, 40b. The latch stop 52a includes a base 51 that overlies the back plate 26a and a spring lever 54 that projects upwardly and laterally from the inboard portion of the base 51. A latching projection 56 rises from the lateral end of the spring lever 54 and is in position to be received in one of the latch stop holes 43 on the latch bar 40a. The latch stop 52a also includes fingers 58 that extend upwardly from the base 51 and help to retain the latch bar 40a in place, and a tab 60 on the lateral end of the spring lever 54. As will be further appreciated from the discussion below, the latch stops 52a, 52b serve as automatic retention mechanisms to hold the pins 46, 48 in their unlatched positions, and also as automatic release mechanisms to automatically return the pins 46, 48 to their latched positions, under appropriate conditions.

Figure 7:
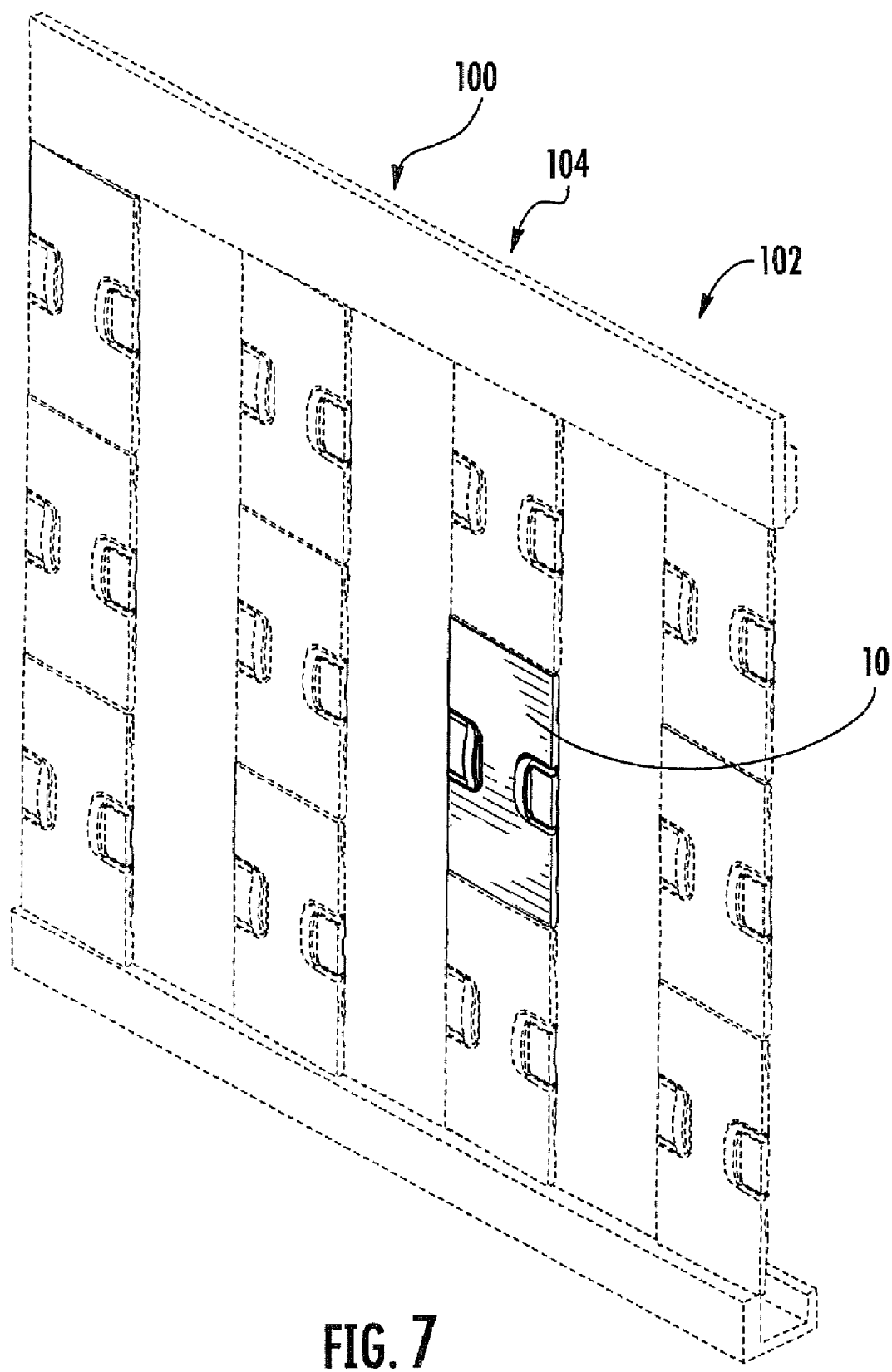
FIG. 7 is a perspective view of the door assembly of FIG. 1 in position in a wall-mounted communications system.
Figure 8:
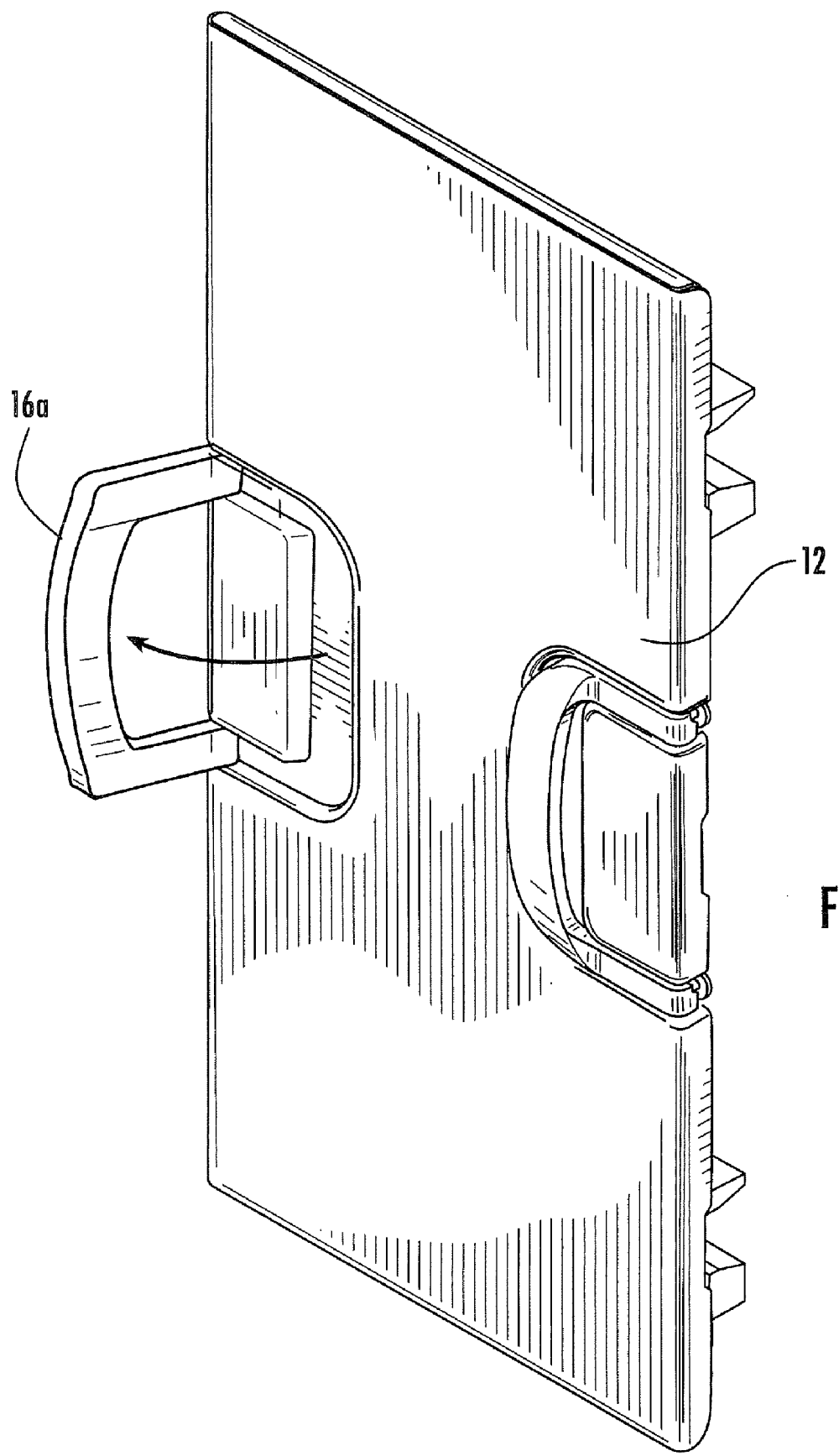
FIG. 8 is a front perspective view of a handle of the door assembly or FIG. 7 in an extended position.
Figure 9:
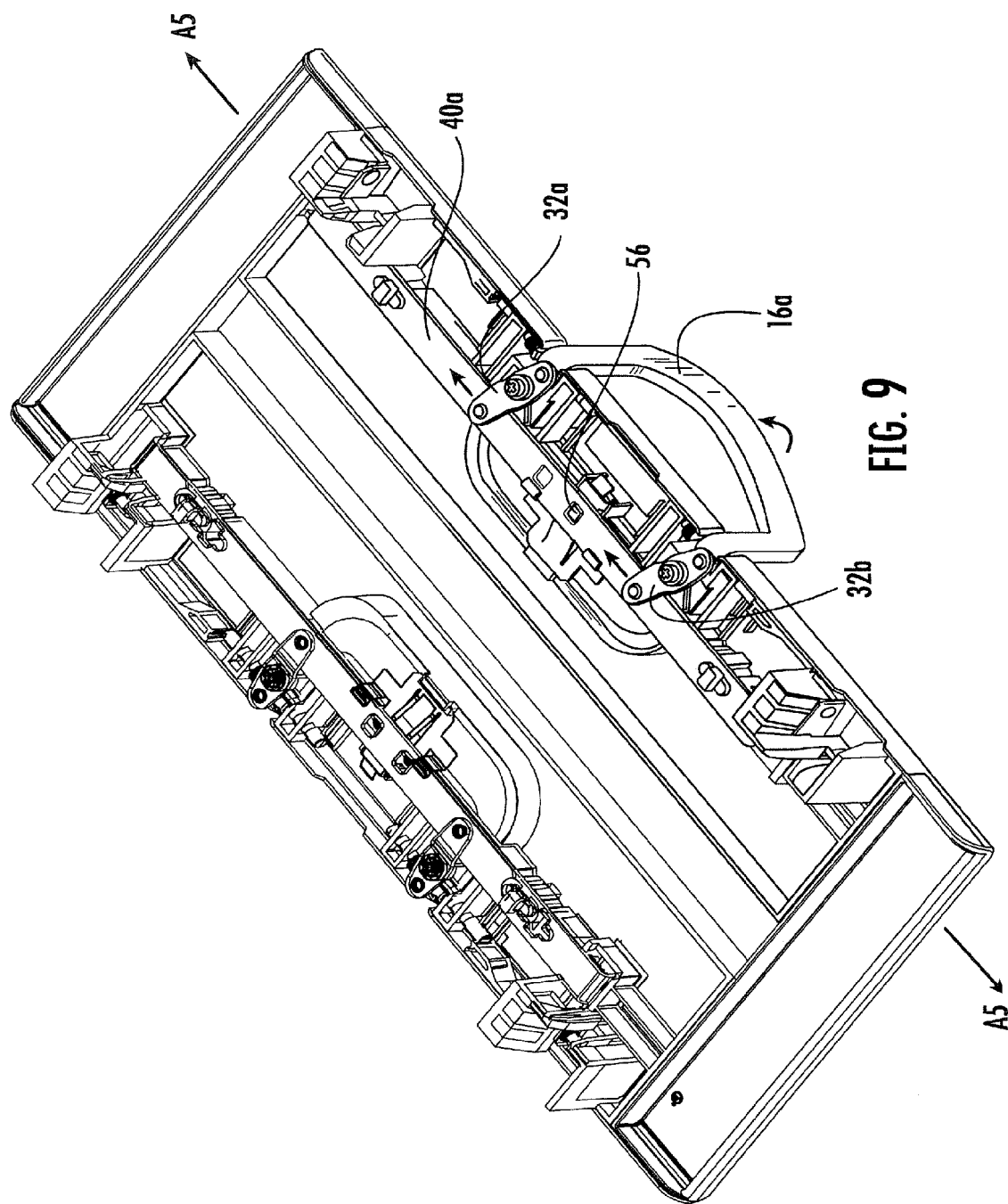
FIG. 9 is a rear perspective view of the door assembly of FIG. 8 with the handle in an extended position.

Referring now to FIG. 7, in accordance with some embodiments of the present invention, the door assembly 10 may be mounted via the pins 46, 48 on two communications racks 100, 102 (which serve as a support structure) in order to cover a trough or space 104 between the racks 100, 102. The trough 104 typically houses cables routed between the racks 100, 102. The presence of the pins 46, 48, which are received in holes or similar openings in the racks 100, 102, prevents the door assembly 10 from opening inadvertently. In this position (the "closed position") as shown in FIG. 7, the door assembly 10 is latched closed on both the left and right sides and serves as a fixed or stationary front wall of the trough 104. The door assembly 10 thus serves to hide, protect and/or contain cords in the trough 104. More particularly, the pins 46, 48 of the latch bar 40a are disposed in a latched position wherein they engage respective mating mount structures of the rack 100 (e.g., are received in mounting holes formed in a rail or post of the rack 100) and the pins 46, 48 of the latch bar 406 are disposed in a latched position wherein they engage respective mount structures of the rack 102 (e.g., are received in mounting holes formed in a rail or post of the rack 102).

When the door assembly 10 is closed as in FIG. 7, the handles 16a, 16b are in a retracted position in which the arms 18 of each handle 16a, 16b reside in their respective recesses 17 and are generally parallel with the front panel 12. Notably, because the handles 16a, 16b are positioned relatively close to each other, they can easily be secured (via a locked chain, a lock with a long shackle, or the like) against unwanted opening, or can be wrapped with a ribbon or the like that acts as a tampering indicator. With the handles 16a, 16b retracted, the pivot bases 20a, 20b of the handles 16a, 16b are oriented such that the upper ends of the cammed surfaces 22 face rearwardly and contact the cam interface pins 36 of the toggle arms 32a, 32b (see FIG. 2). The handles 16a, 16b are urged toward this retracted position by the springs 30 acting on the handle pins 24a, 24c.

Referring to FIGS. 2 and 3, with the cam interface pins 36 contacting the upper ends of the cammed surfaces 22, the toggle arms 32a, 32b are generally horizontally disposed. Accordingly, the latch bars 40a, 40b are in a lowered position relative to the back plates 26a, 26b. In this lowered position, the pins 46, 48 of each latch bar 40a, 40b are in their respective latched positions wherein they are inserted through and protrude downwardly from their respective compartments 46a, 48a into their mating holes in the racks 100, 102. As noted above, the latch bars 40a, 40b are urged downwardly by the spring acting on the ribs 49 and the bottom flange 47. In addition, the spring levers 54 of the latch stops 52a, 52b are slightly deflected from their relaxed positions and press against the undersides of the respective latch bars 40a, 40b.

If desired, the operator can open the door assembly 10 from either the left side or the right side to access the trough 104 without removing the door assembly 10 from the racks 100, 102. To open the door assembly 10 from either side, a user simply grasps the appropriate handle 16a, 16b and rotates it so that the grasping portion 19 moves away from the front panel 12 and laterally. The handle 16a and the linkage between the handle 16a and the pins 46, 48 serve as a first actuator to transition the pins 46, 48 from their latched positions to their unlatched positions. More particularly, referring to FIGS. 8-10, in which the handle 16a is rotated, rotation of the handle 16a causes the pivot bases 20a, 20b and handle pins 24a, 24b. 24c, 24d to rotate about the axis A1. As the pivot bases 20a, 20b rotate, the cammed surface 22 of each rotates also, such that eventually the lower end of each cammed surface 22 faces rearwardly and is in contact with the cam interface pin 36 (rotation of the handle 16a ceases when a stepped surface 37 on the pivot base 20a contacts the cam interface pin 36). This interaction drives the cam interface pin 36 downwardly, which in turn causes the toggle arms 32a, 32b to rotate about the pivots 34a, 34b (clockwise from the vantage point of FIGS. 9 and 10). The rotation of the toggle arms 32a, 32b drives the inboard ends of the toggle arms 32a, 32b upwardly along the axis A5, which consequently drives the latch bar 40a upwardly. This action slides or lifts the pins 46, 48 out of the holes in the rack 100 and into their respective unlatched positions, thereby freeing the left side of the door assembly 10 (from the vantage point of FIG. 11) from the rack 100. According to some embodiments, the pins 46, 48 are slid out of the mount holes along a slide axis that is substantially parallel to the pivot axis A6. According to some embodiments, the slide axis extends substantially vertically.

Figure 11:
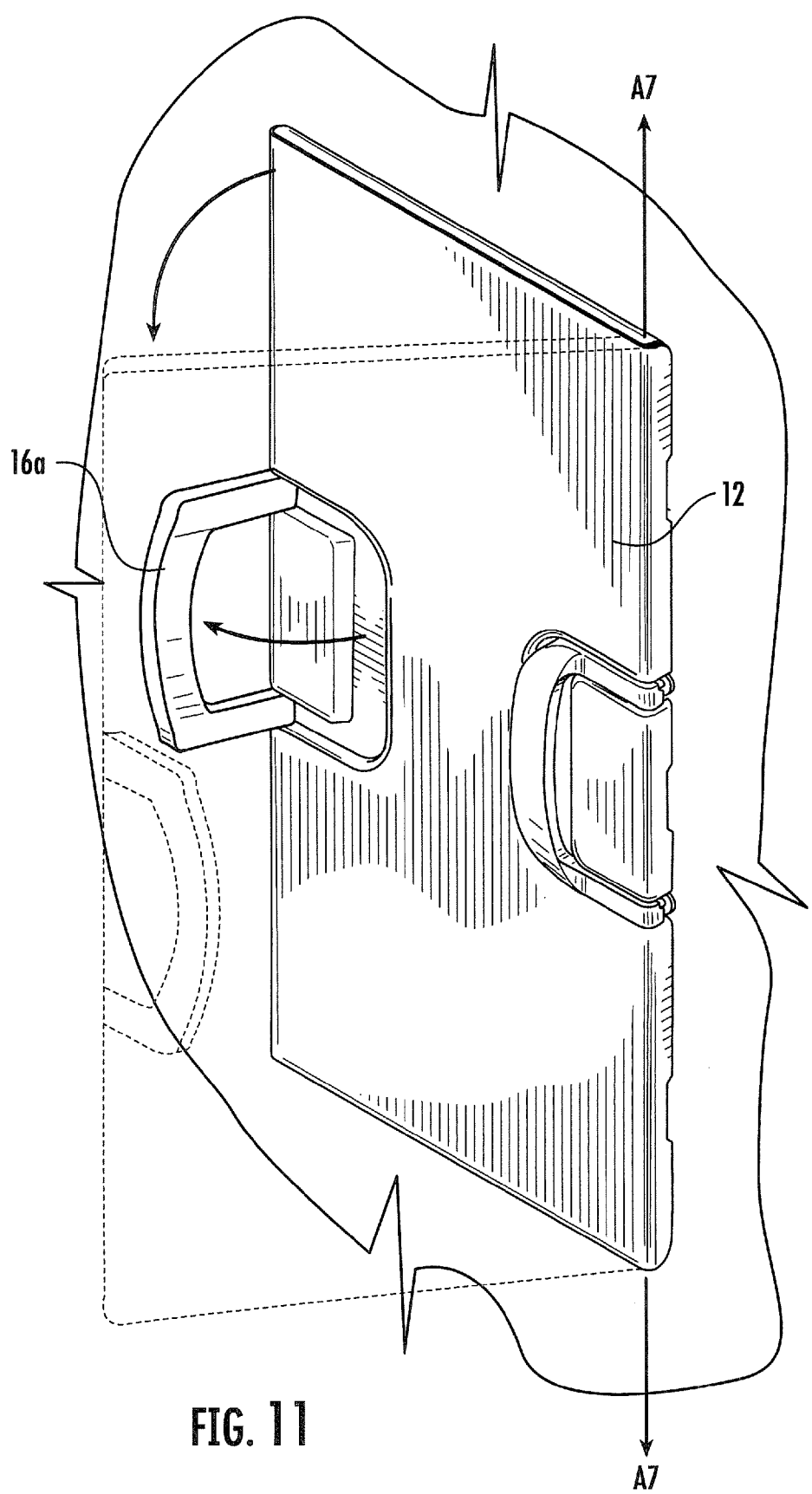
FIG. 11 is an enlarged front perspective view of the door assembly of FIG. 8 showing that extension of the left side handle allows the door to pivot about an axis extending through its right side.
Figure 12:
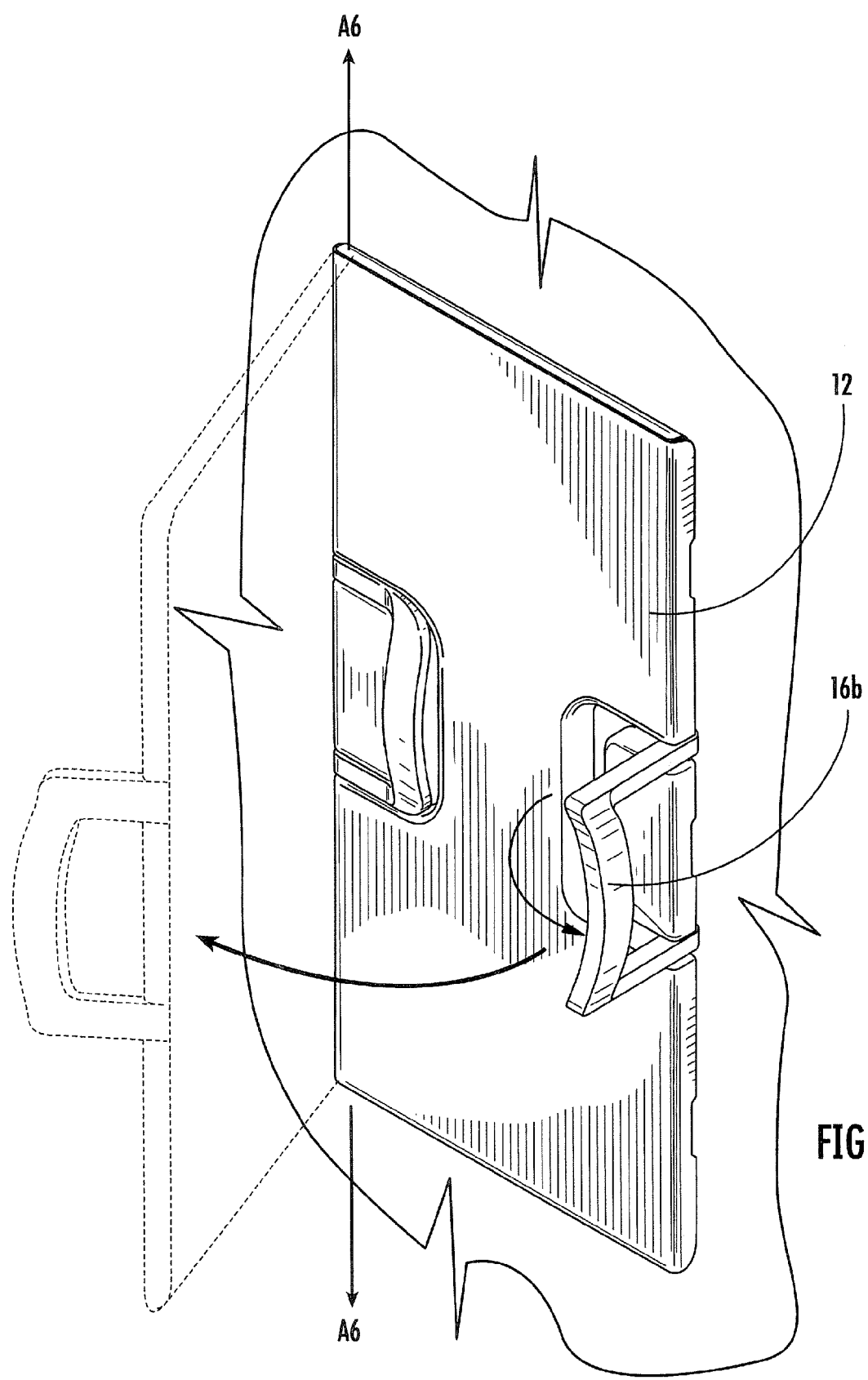
FIG. 12 is an enlarged front perspective view of the door assembly of FIG. 8 showing that extension of the right side handle allows the door assembly to pivot about an axis extending through its left side.
Figure 13:
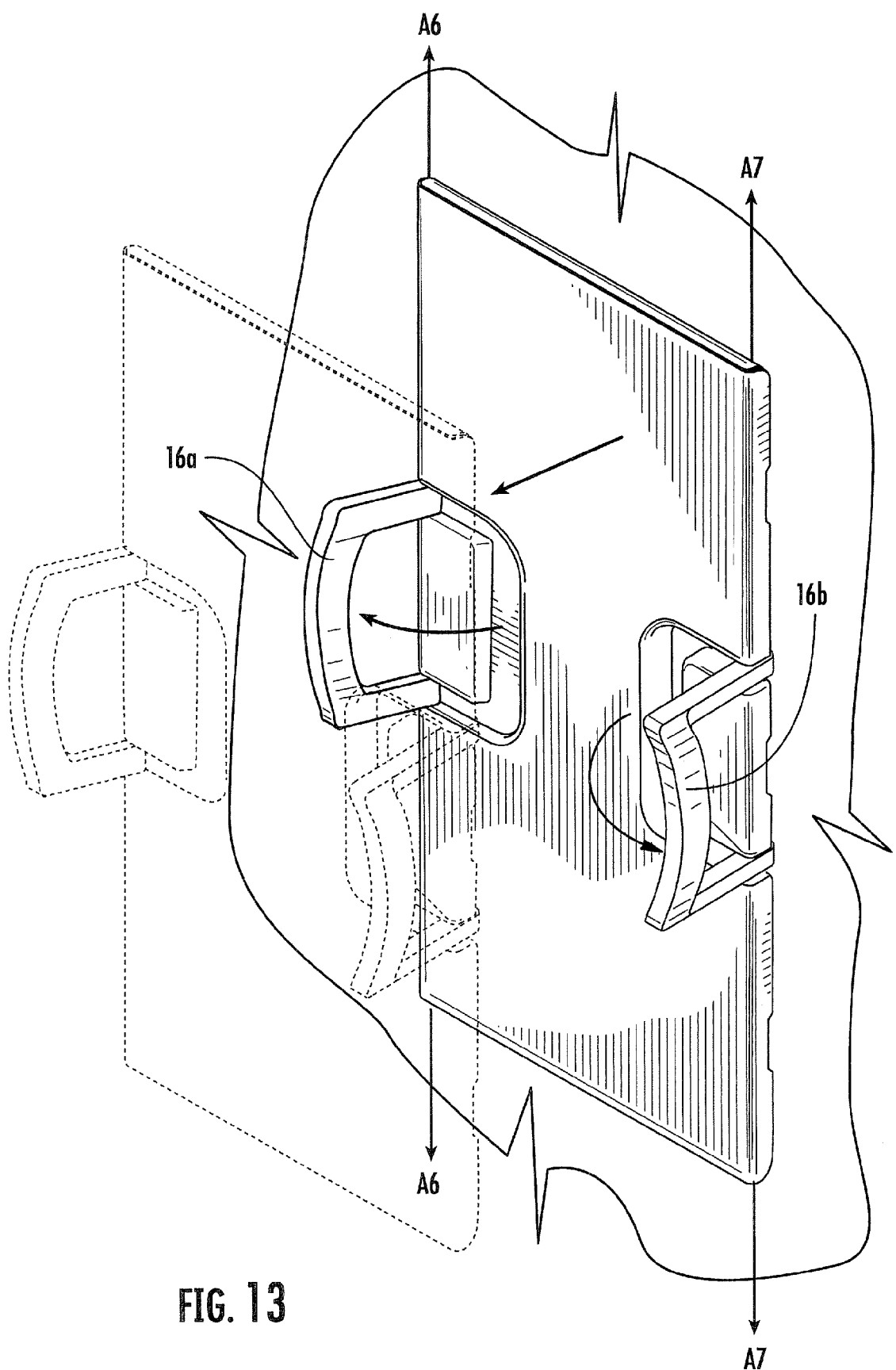
FIG. 13 is an enlarged front perspective view of the door assembly of FIG. 8 showing that extension of both handles allows the door assembly to be removed from its mounted position.

With the pins 46, 48 of the latch bar 40a free and the pins 46, 48 of the latch bar 406 still pivotally engaged with the mount holes of the rack 102, the door assembly 10 can be pivoted about the axis A7 (i.e., the axis of the pins 46, 48 of the latch bar 40b) on the right side of the door assembly 10 to an open position (see FIG. 11). In this manner, the pins 46, 48 of the latch bar 40a and the receiving mount hole of the rack 102 serve as a hinge assembly and the door assembly 10 can be opened as a right side hinged door. Because of the location and configuration of the pins 46, 48 of the latch bar 40a, the door assembly 10 can open to a position greater than 90 degrees from its closed position.

Figure 10:
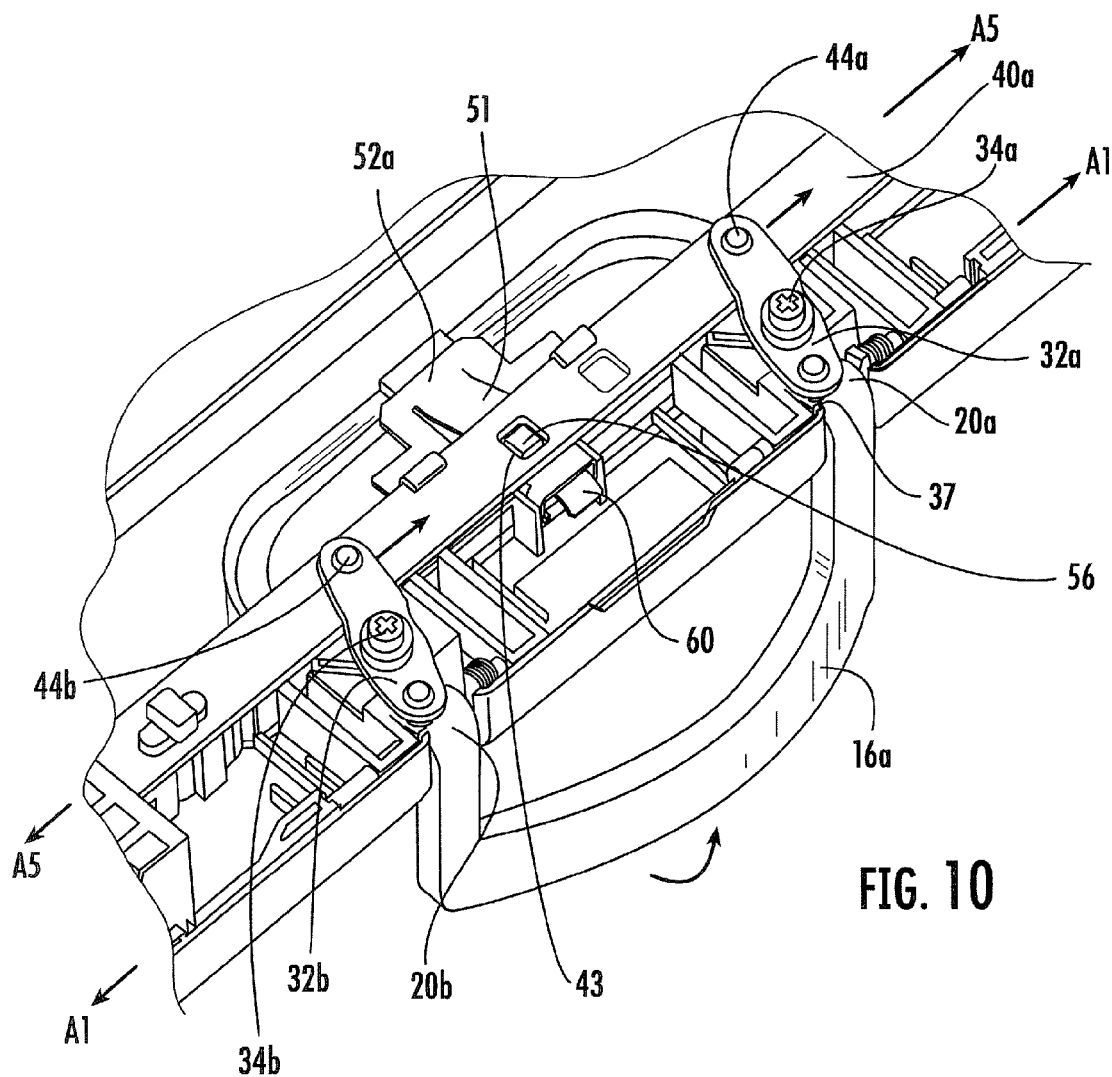
FIG. 10 is an enlarged rear perspective view of the door assembly of FIG. 8 with the handle in an extended position.

As the latch bar 40a rises in response to the handle 16a moving to its extended position, the latch stop hole 43 aligns with the projection 56 of the latch stop 52a (see FIG. 10). When this occurs, the spring lever 54 is free to spring upwardly, which forces the projection 56 into the latch stop hole 43. The presence of the projection 56 automatically retains the latch bar 40a in a raised condition even when the handle 16a is released by the user.

Alternatively, with the handle 16a released and the pins 46, 48 of the latch bar 40a inserted in the pivot holes of the rack 100, the right side handle 16b (which, along with the linkage between the handle 16b and the pins 46, 48 of the latch bar 40b, serves as a second actuator can be grasped and rotated to lift the latch bar 40b via the toggle arms 32a, 32b. This action slides the pins 46, 48 of the latch bar 40b into their unlatched positions, and the door assembly 10 is thereby freed to rotate about the axis A6 and move to an open position (see FIG. 12). In this manner, the door assembly 10 can be opened as a left side hinged door. Thus it can be seen that the pins 46, 48 can serve as both latches and hinges for the door assembly 10 on either side.

As a further option for the operator, both handles 16a, 16b can be grasped and moved to their respective extended positions simultaneously. Extension of both handles 16a, 16b allows the door assembly 10 to be removed from the racks 100, 102 entirely by drawing the pins 46, 48 on both sides of the door assembly 10 from their respective holes in the racks 100, 102 (i.e., into their unlatched positions, see FIG. 13). The presence of both handles 16a, 16b in their mirror image locations can facilitate two-handed removal of the door assembly 10.

The door assembly 10 can be returned to its closed position (FIG. 7) by pivoting the door assembly about the latched/hinged side (if one side is already engaged with its rack 100, 102) or pushing the door assembly 10 to back into the racks 100, 102 (if neither side is engaged with the racks 100, 102). The closing operation is the same for each of the left and right sides of the door assembly 10, and therefore the closing operation will be described with reference to closing of the left side, it being understood that this description likewise applies to closing of the right side.

Proper alignment of the door assembly 10, and especially the pins 46, 48, with the mount structures or holes of the racks 100, 102 may be facilitated by the guide features 46a, 48a.

The latch stop 52a can be disengaged by forcing the tab 60 on the spring lever 54 toward the front panel 12. In some embodiments, the rack 100 will include a post or other structure positioned to contact the tab 60 as the door assembly 10 closes. Such a force disengages the projection 56 from the latch stop hole 43 on the latch bar 40a to automatically release the latch bar 40a. The latch bar 40a is then free to return to its lowered position along the axis A5. This action is encouraged by the spring acting on the rib 49 and the bottom flange 47. As the latch bar 40a descends, the pins 46, 48 are reinserted into their mating holes in the rack 100 (i.e., returned to their latched positions). In this manner, the tab 60 serves as an automatic release mechanism for the latch bar 40a so that the operator need only position the door assembly 10 in the closed position and is not required to operate the handle 16a to lower the pins 46, 48 into latching engagement.

Those skilled in this art will appreciate that the door assembly 10 and components thereof may take different forms from those specifically illustrated and described herein. For example, the front panel 12 need not be planar. It may include a window for viewing objects inside or, in conjunction with the latch bar 40a or other component, could provide visual access to an indicator of whether the door assembly 10 is open or closed. The back plates 26a, 26b may have some additional structures included and/or some structures omitted.

The handles 16a, 16b may also be configured differently. They may be designed to rotate more or less than the 90 degrees of rotation shown herein. They may be configured to open "out-to-in" rather than "in-to-out", and need not be mirror images (i.e., one handle may open "in-to-out" while the other opens "out-to-in"). The cammed surfaces 22 of the pivot bases 20a, 20b may be configured similar to a lead screw or a worm gear. The grasping portions 19 may be straight or arcuate in only one direction.

The latching components may also take different forms. For example, in some embodiments the toggle arms 32a, 32b may have a different length or shape, or may be omitted entirely, such that the latch bar interacts directly with the cammed surface 22. The latch bars 40a, 40b may be of different lengths and may take a different form (for example, a wireform configuration may be employed). The latch bars 40a, 40b may be rely on gravity rather than springs to remain in place, and may be identical rather than mirror images of each other (this may have cost benefits). The latch stops 52a, 52b may be omitted. With the inclusion of an additional toggle arm or the like, the latch mechanism may be configured such that only one handle can be opened at a time, if such function is desirable.

The door assembly 10 may also be mounted on a telecommunications cabinet, a telecommunications rack, or wall-mounted shelves as desired.

Figure 14:
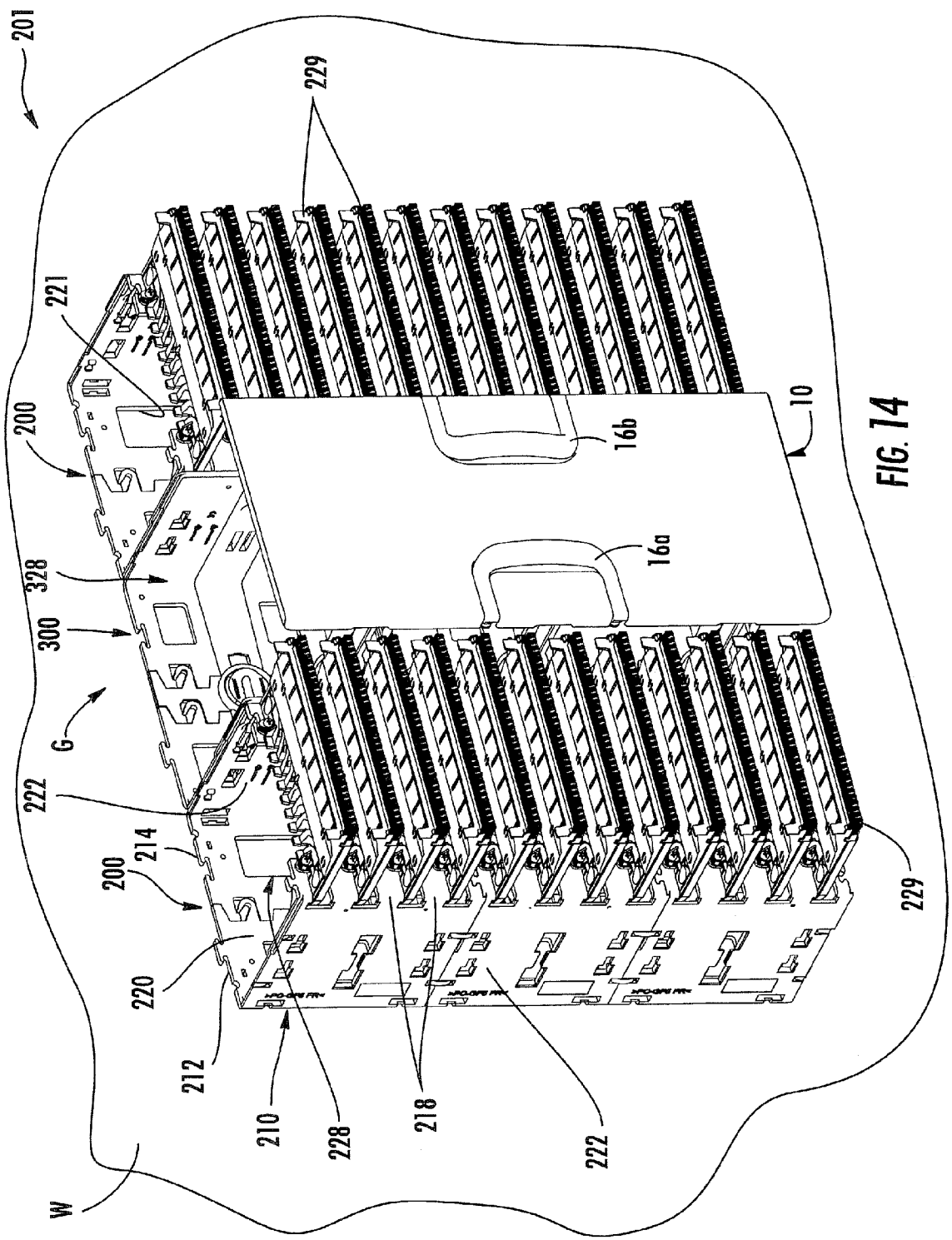
FIG. 14 is a front perspective view of a terminal block panel system according to embodiments of the present invention including the door assembly of FIG. 1.
Figure 15:
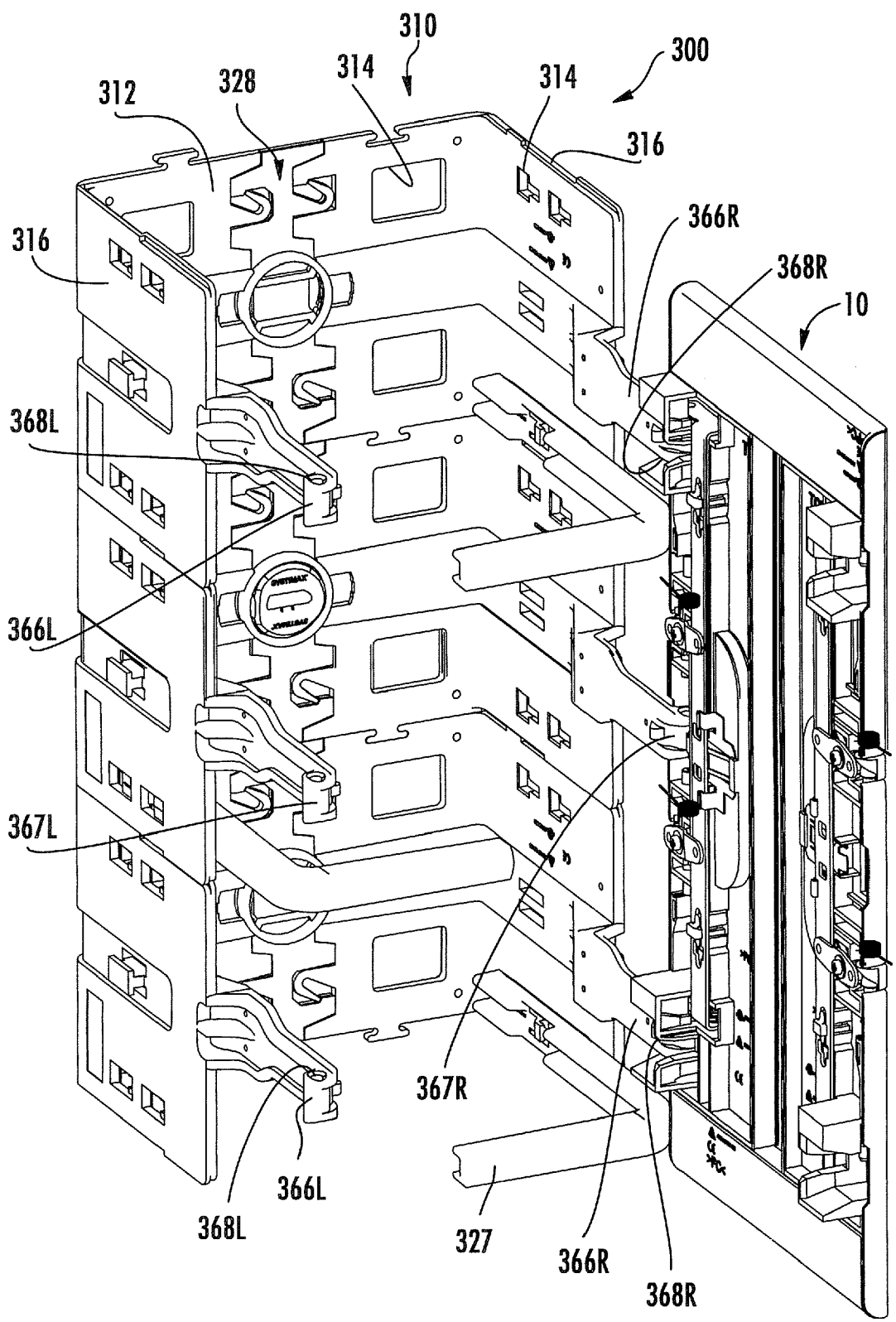
FIG. 15 is a front perspective view of a spacer bracket assembly forming a part of the terminal block panel system of FIG. 14.

Turning now to FIGS. 14 and 15, a terminal block panel system 201 in accordance with further embodiments of the present invention and including the door assembly 10 is shown therein. The system 201 includes a spacer bracket assembly 300 in accordance with embodiments of the present invention. The system 201 further includes a pair of terminal block panels or patch panel assemblies 200. The panel assemblies 200 are mounted on a wall W in side-by-side, spaced apart arrangement such that a space or volume G is defined therebetween. The spacer bracket assembly 300 is mounted in the space G. The spacer bracket assembly 300 may be secured to the wall W and/or one or both of the back panel assemblies 200. The spacer bracket assembly 300 defines a cable trough 328 through which cords may be routed for connecting connection blocks 229 mounted on the back panel assemblies 100, 200. The door assembly 10 protects and hides cords in the trough 328, and the latch system thereof permits selective access to the trough 328 in the manner described above with reference to FIGS. 7-13.

The back panel assemblies 200 are exemplary and may be configured differently than illustrated and described herein. The panel assemblies 200 may be configured in the same manner and, therefore, only the panel assembly 200 will be described in detail hereinafter, it being appreciated that this description likewise applies to the other panel assembly 200. The panel assembly 200 may as a matter of design choice be manufactured as a 900 pair device, a 300 pair device, a 100 pair device, or any other configuration as is known in the art. The panel assembly 200 may be a panel assembly as disclosed in U.S. Pat. No. 6,106,329 to Baker, III et al., the disclosure of which is incorporated herein by reference in its entirety.

The panel assembly 200 includes a C-shaped back panel 210. The back panel 210 may be manufactured, such as by molding, from an electrically nonconductive material such as a foamed plastic or polymeric material. The back panel 210 may include a first panel member 212 and a second panel member 214 that are attached together to form the back panel 210.

The back panel 210 includes a rear or securing wall 220, a pair of opposed side walls 222, and a series of mounting structures 218 extending along the front edge of each side wall 222. According to some embodiments and as shown, the mounting structures 218 are configured as a plurality of tangs, which may be spaced equidistant from each other. Each tang can have a mounting hole or other securing feature to facilitate mounting thereto of interface devices, such as connection blocks 229. In a typical application, a single connection block 229 may be mounted across two opposing tangs 218.

A cable trough 228 is formed which is bounded between the side walls 222, the securing wall 220 and the mounting structures 218. The trough 228 is provided to house, contain or receive a plurality of communication cables (not shown), some of which simply extend through and along the trough while others are connected to devices such as connection blocks 229 that are mounted to mounting structures 218. Cable management structures such as loop members may be secured to the back panel 210 to hold or guide the cables in the trough 228.

Each securing wall 220 has one or more cut-outs or fastener holes 221 or other features for releasably mounting the back panel 210 to a hook or fastener, such as a screw secured to or mounted on a wall or backboard. Other securing devices such as nails, clips, etc. may be used for securing the back panel 210 to a wall or other structure.

Turning now to the spacer bracket assembly 300 in more detail, the spacer bracket 310 serves as a support structure and may be C-shaped and formed of the same materials and in the same manner as described above with regard to the back panel 210 (e.g., of a two-piece, interlocking design). The spacer bracket 310 includes a rear or securing wall 312 and opposed, spaced apart side walls 316 extending forwardly from the securing wall 312.

The cord trough 328 is defined between the side walls 316 and the securing wall 312. The trough 328 has a depth that may, for example, be the height of the side walls 316, and a width defined between the opposed side walls 316. The trough 328 is provided to house, contain or receive a plurality of communication cords (not shown), which may extend through and along the trough 328 and to devices such as connection blocks 229 that are mounted on each of the panel assemblies 200. Cable management structures such as retention bars 327 may be secured to the spacer bracket 310 to hold or guide the cables in the trough 328.

The securing wall 312 may have one or more cut-outs or fastener holes 314 or other features for releasably mounting the spacer bracket 310 on an adjacent back panel 200 or a hook or fastener, such as a screw secured to or mounted on a wall or backboard. Other securing devices such as nails, clips, etc. may be used for securing the spacer bracket 310 to a wall or other structure.

A pair of left side mount structures 366L and a pair of right side mount structures 366R are provided on the front of the spacer bracket 310 (FIG. 3). A left side trigger structure 367L and a right side trigger structure 367R are also provided on the spacer bracket 310. For example, the structures 366L, 366R, 367L, 367R may be integrally molded on the side walls 316. The structures 366L, 366R, 367L, 367R may be forwardly and inwardly extending posts or tabs as shown. The mount structures 366L, 366R define pivot holes or slots 368L, 368R within which the respective pins 46, 48 of the latch bars 40a, 40b are slidably and pivotably mounted for vertical reciprocation and rotation about a vertical axis.

In a typical application, the back panel assemblies 200 and the spacer bracket 310 are mounted in an equipment closet or other structure. The back panel assemblies 200 and the spacer bracket 310 may be mounted on the support wall W using any suitable securing devices. For example, screws (e.g., drywall screws) may be mounted in the support wall and the back panel assemblies 200 and the spacer bracket 310 can thereafter be hung on the screws with the heads of the screws inserted through the fastener holes 221, 314. Similarly, hooks (individual or mounted on a shared hanger rod or the like) may be mounted on the support wall W and the back panel assemblies 200 and the spacer bracket 310 can thereafter be hung on the hooks with the hooks inserted through the fastener holes 221, 314. Suitable clips may be used in place of or in addition to screws or hooks. As a further alternative, the back panel assemblies 200 and the spacer bracket 310 can be positioned on the wall and screws or the like can be driven through the walls 220, 312 and into the support wall W. In this case, the screws may be driven through the holes 221, 314 and/or through the material of the walls 220, 312. Various different techniques may be used to mount each of the back panel assemblies 200 and the spacer bracket 310, and one or more of the back panel assemblies 200 and the spacer bracket 310 may be supported by another of the back panel assemblies 200 and the spacer bracket 310 instead of or in addition to being supported by the support wall W. For example, according to some embodiments, the support bracket 310 is secured to and supported by one or both of the back panel assemblies 200. According to some embodiments, this is accomplished by mating integral interlocking features of the spacer bracket 310 and the back panel assemblies 200.

The back panel assemblies 200 and the spacer bracket 310 once mounted may be used to provide an interface between devices contained in an environment and devices contained outside the environment. The interface may be completed by way of cables passing through the back panel assembly 200 to interface devices (e.g., connection blocks 229 or other interfacing devices) mounted to the mounting structures 218 of the back panel assembly 200. Cords may pass through a back panel assembly 200, into and through the trough 328 of the spacer bracket assembly 300, and into and through the other back panel assembly 200 to interface devices mounted to the mounting structures 218 of the second back panel assembly 200.

The door assembly 10 can be mounted on, opened and removed from the spacer bracket 310 in substantially the same manner as described above with regard to the rack system of FIG. 7. More particularly, with each of the latch bars 40a, 40b in the latched position, the upper and lower pins 46, 48 of the latch bar 40a are received in the upper and lower left side pivot holes 368L and the upper and lower pins 46, 48 of the latch bars 40b are received in the upper and lower right side pivot holes 368R so that the door assembly 10 is supported by the posts 366L, 366R in the closed position (FIG. 14). The left handle 16a can be rotated to lift and withdraw the pins 46, 48 of the latch bar 40a out of the pivot holes 3681, (i.e., into their unlatched positions), whereupon the operator can pivot the door assembly 10 about the pivot pins 46, 48 of the latch bar 40a to open the door assembly 10 from the left side. Alternatively, the right side handle 166 can be operated to pivot the door assembly 10 about the pivot pins 46, 48 of the latch bar 40b to release the pins 46, 48 from the posts 366R and thereby permit the operator to open the door assembly from the right side. Alternatively, both handles 16a, 16b can be rotated to release the pins 46, 48 of both latch bars 40a, 40b from the posts 366L, 366R to permit full removal of the door assembly 10 from the spacer bracket 310.

As discussed above, when each latch bar 40a, 40b is moved into its unlatched position, the latch stops 52a, 52b thereof cooperate with the latch stop holes 43 to operate as automatic retention mechanisms to hold the latch bars 40a, 40b in their unlatched positions. When the door assembly 10 is returned to the closed position on the left side, the tab 60 of the latch stop 52a strikes and is pushed toward the door panel by the left side trigger post 367L to disengage the projection 56 from the latch stop hole 43 and release the latch bar 40a into the latched position. Likewise, the right side trigger post 367R acts on the latch stop 52b to automatically release the latch bar 40b. The posts 367L, 367R are received in the compartments of the guide features 46a, 48a (FIG. 2) to facilitate alignment between the pins 46, 48 and the holes 368L, 368R.

Figure 16:
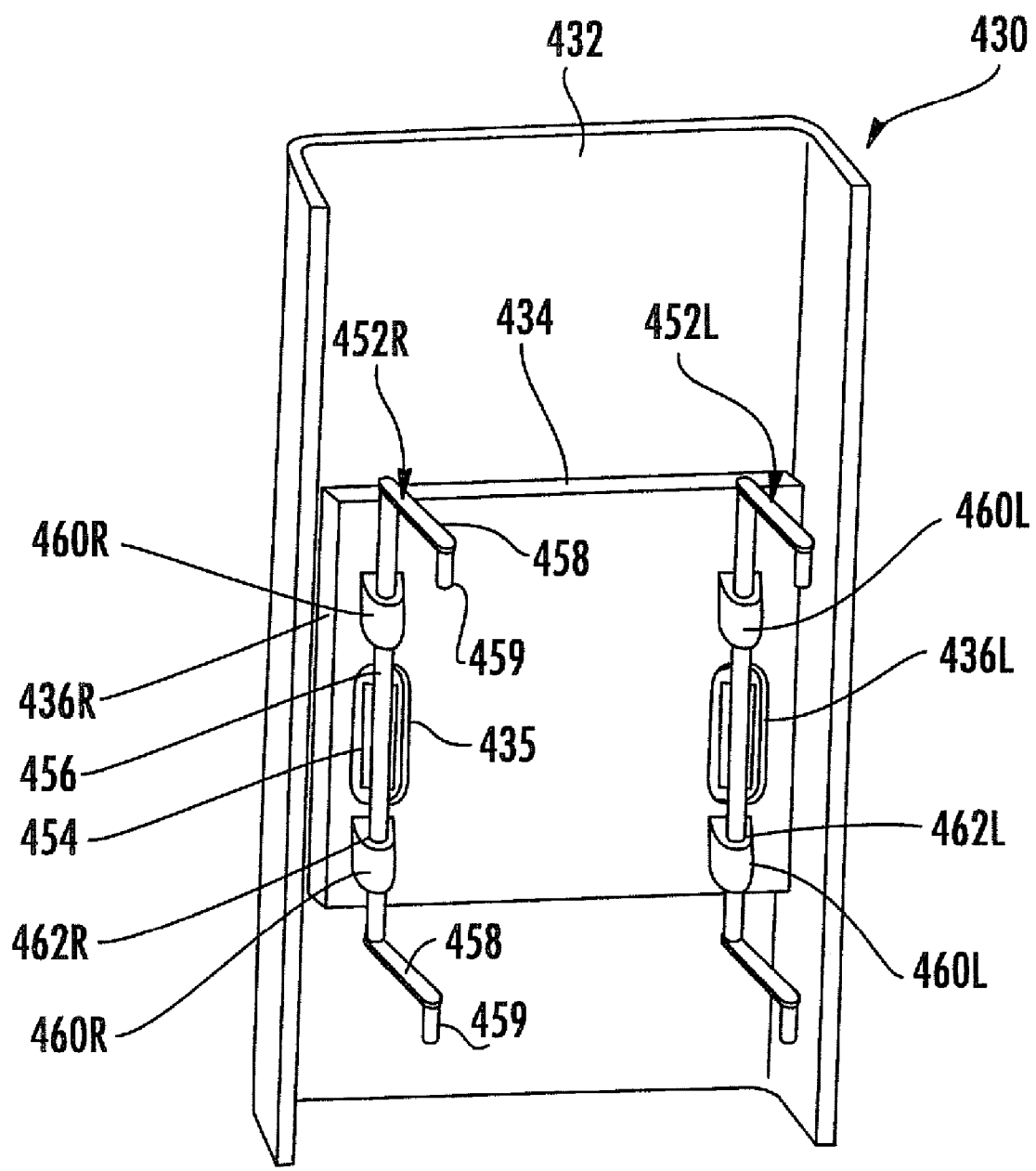
FIG. 16 is a rear perspective view of a door assembly for a communications rack, cabinet or wall-mounted system according to further embodiments of the present invention.
Figure 18:
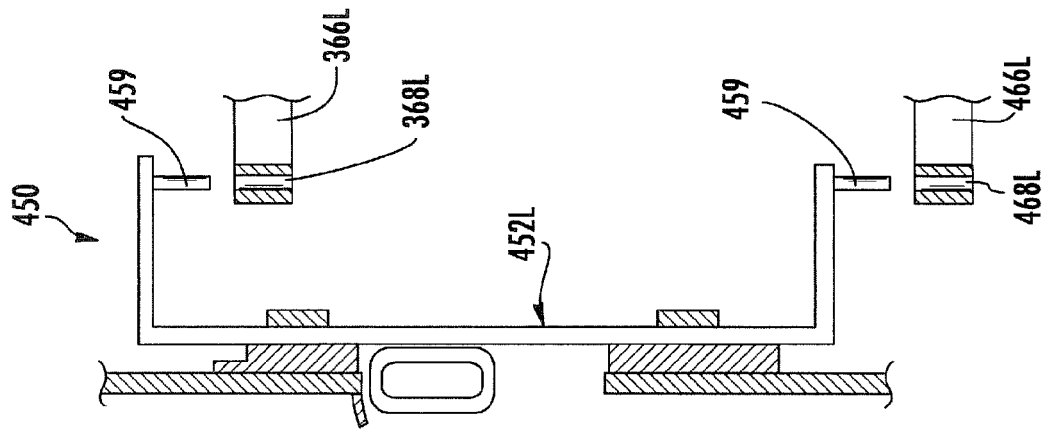
FIG. 18 is a side cross-sectional view of the door assembly of FIG. 16 with the latch mechanism thereof in an unlatched position.
Figure 17:
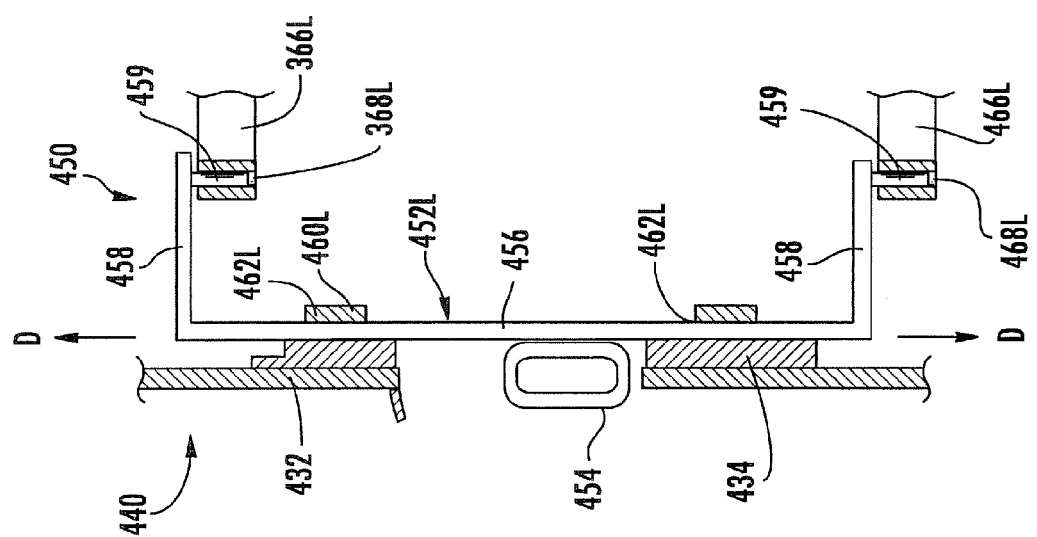
FIG. 17 is a side cross-sectional view of the door assembly of FIG. 16 with a latch mechanism thereof in a latched position.

With reference to FIGS. 16-18, a door assembly 430 including a latch system 450 according to further embodiments of the present invention is shown therein. The door assembly 430 may be used in place of the door assembly 10. The door assembly 430 includes a subframe 434 and a front panel 432 secured to the subframe 434, for example, by adhesive, fasteners, insert molding, etc. According to some embodiments, the subframe 434 is formed of a polymeric or plastic material and the panel 432 is formed of metal. The subframe 434 has a left side edge 436L and a right side edge 436R. A pair of openings 435 are formed in the subframe 434. Two holes 433 are formed in the front panel 432 and are aligned with the openings 435.

The latch system 450 includes a left side latch member 452L and a right side latch member 452R. Each latch pin 452L, 452R includes a handle 454, a body 456, a pair of legs 458 extending rearwardly from either end of the body 456, and a pair of hinge or latch pins or posts 459 extending downwardly from the rearward end of each leg 458. The latch members 452L, 452R may be integrally formed and may be formed using any suitable method and material(s). According to some embodiments, the latch members 452L, 452R are formed of metal. The handles 454 may be configured as ergonomic thumb tabs or loops.

The left and right latch members 452L, 452R are mounted adjacent the left and right side edges 436L, 436R, respectively, of the door subframe 434. More particularly, left retention structures 460L and right retention structures 460R are provided on the subframe 434, for example, by integral molding. The retention structures 460L, 460R define slide holes 462L, 462R within which the respective bodies 456 of the latch members 452L, 452R are slidably mounted for vertical reciprocation along a slide axis D-D (FIG. 17). The handles 454 extend through or are accessible through respective openings 433, 435 in the door assembly 430.

For purposes of explanation, the door assembly 430 will be described as it may be used with the spacer bracket assembly 300 of FIG. 15. The latch system 450 is configured such that the latch members 452L, 452R can be independently and selectively moved by the user between a latched position and an unlatched position. When a latch member 452L, 452R is in its latched position, the pins 459 thereof are positioned in the corresponding pivot holes 368L, 368R as shown in FIG. 17. When a latch member 452L, 452R is in its unlatched position, the pins 459 thereof are withdrawn from the corresponding pivot holes 368L, 368R as shown in FIG. 18. While only the latch member 452L is shown in FIGS. 17 and 18, it will be understood that the latch member 452R operates in the same manner with respect to the pivot holes 368R.

The door assembly 430 is mounted on the spacer bracket 310 by raising the latch members 352L, 352R into their unlatched positions (FIG. 18), positioning the door assembly 430 on the front of the spacer bracket 310, and lowering the latch members 452L, 452R into their latched positions (FIG. 17) so that their respective pins 459 are received in the holes 368L, 368R of the posts 366L, 366R.

If desired, the operator can remove the door assembly 430 from the spacer bracket 310. To do so, the operator raises the latch members 452L, 452R into their unlatched positions (FIG. 18) so that the pins 459 of both of the latch members 452L, 452R are withdrawn from the holes 368L, 368R of the posts 366L, 366R. The operator then pulls the door assembly 430 away from the spacer bracket 310.

If desired, the operator can open the door assembly 430 from either side to access the trough 328 without removing the door assembly 430 from the spacer bracket 310. More particularly, the operator raises the latch member 452L into its unlatched position so that the pins 459 of the latch member 452L are withdrawn from the holes 368L of the post 366L. The latch member 452R is left in its latched position so that the pins 459 thereof remain in the holes 368R. The operator then pivots the door assembly 430 to the right away from the spacer bracket 310 about the pins 459 of the latch member 452R.

Alternatively, the operator can open the door assembly 430 as a left side hinged door. More particularly, the operator raises the latch member 452R into its unlatched position to that the pins 459 of the latch member 452R are withdrawn from the holes 368R of the post 366R. The latch member 452L is left in its latched position so that the pins 459 thereof remain in the holes 368L to provide a left side hinge assembly. The operator then pivots the door assembly 430 to the left away from the spacer bracket 310 about the pins 459 of the latch member 452L.

While the door assembly 10 has been described above mounted on the racks 100, 102 and on the spacer bracket 310 and the door assembly 430 has been described mounted on the spacer bracket 310, door assemblies according to embodiments of the present invention may be operably mounted on other types or configurations of support structures to form communications cable management systems according to further embodiments of the present invention. The support structure may be comprised of a single or integral unit (like the spacer bracket 310) including the mount structures for both sides of the door assembly. Alternatively, the support structure may be two or more physically separated units (e.g., like the racks 100, 102) including the mount structures for respective sides of the door assembly. According to some embodiments, a door assembly according to the present invention (e.g., the door assembly 10 or 430) is mounted on a terminal block panel such as the terminal block panel 200 modified to include suitable mount structures such as the posts 366L, 366R (and, optionally, trigger structures such as the posts 367L, 367R). The door assembly 430 may be mounted on racks such as the racks 100, 102.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

What is claimed is:

1. A communications cable management system comprising:
    a support structure defining a cable trough and including at least two first mount structures and at least two second mount structures spaced apart from the at least two first mount structures; and
    a door assembly including:
        a door body having first and second opposed side edges;
        a first latch mechanism including at least two first latch structures each selectively positionable between a latched position, wherein the first latch structure engages a respective one of the first mount structures to secure the door body to the support structure for pivotal movement therebetween about a first pivot axis proximate the first side edge of the door body, and an unlatched position, wherein the first latch structure is disengaged from the first mount structure to permit the first side edge of the door to be separated from the support structure;
        a second latch mechanism including at least two second latch structures each selectively positionable between a latched position, wherein the second latch structure engages a respective one of the second mount structures to secure the door body to the support structure for pivotal movement therebetween about a second pivot axis proximate the second side edge of the door body, and an unlatched position, wherein the second latch structure is disengaged from the second mount structure to permit the second side edge of the door to be separated from the support structure;
        a first actuator operable by a user to selectively move each of the first latch structures as a group from their latched positions to their unlatched positions; and
        a second actuator operable by a user to selectively move each of the second latch structures as a group from their latched positions to their unlatched positions;
        wherein:
            when the first and second latch structures are in their latched positions, the door body is secured in a closed position on the support structure;
            when the first and second latch structures are in their unlatched positions, the door body can be removed from the support structure;
            when the first latch structures are in their latched positions and the second latch structures are in their unlatched positions, the door body can be pivoted open about the first pivot axis; and
            when the second latch structures are in their latched positions and the first latch structures are in their unlatched positions, the door body can be pivoted open about the second pivot axis.

2. The communications cable management system of claim 1 wherein:
    the first and second mount structures each define a pin slot;
    the first and second latch structures each include a pin;
    the first actuator is operable to slide the pins of the first latch structures out of the respective pin slots of the first mount structures along a first slide axis that is substantially parallel to the first pivot axis; and
    the second actuator is operable to slide the pins of the second latch structures out of the respective pin slots of the second mount structures along a second slide axis that is substantially parallel to the second pivot axis.

3. The communications cable management system of claim 2 wherein the first and second slide axes extend substantially vertically.

4. The communications cable management system of claim 1 including an automatic retention mechanism adapted to automatically hold the first latch structures in their unlatched positions when the first actuator is operated to move the first latch structures from their latched positions to their unlatched positions and the door body is opened about the second pivot axis or removed from the support structure.

5. The communications cable management system of claim 4 including an automatic release mechanism adapted to automatically return the first latch structures to their latched positions when the door assembly is returned to a closed position while the first latch structures are being held in their unlatched positions by the automatic retention mechanism.

6. The communications cable management system of claim 1 wherein the door body includes a handle recess, and the first actuator includes a handle that is at least partially received in the handle recess.

7. The communications cable management system of claim 1 wherein the first actuator includes a first handle, the second actuator includes a second handle, and the first and second actuators are operable by rotating the first and second handles in opposite directions to move the first and second latch structures from their latched positions to their unlatched positions.

8. The communications cable management system of claim 1 including at least one subframe member mounted on the door body, wherein the first and second latch mechanisms and the first and second actuators are coupled to the door body by the at least one subframe.

9. The communications cable management system of claim 8 including first and second separate subframe members mounted on the door body, wherein the first latch mechanism and the first actuator are coupled to the door body by the first subframe, and the second latch mechanism and the second actuator are coupled to the door body by the second subframe.

10. The communications cable management system of claim 1 wherein the first actuator includes a rotatable handle and a cam configured to convert rotational movement of the handle to translational movement of the first latch structures to move the first latch structures from their latched positions to their unlatched positions.

11. The communications cable management system of claim 10 wherein the first actuator further includes a stop structure to limit rotation of the handle.

12. The communications cable management system of claim 1 wherein the door assembly includes locator features to guide the door assembly into a prescribed mating position with the first and second mount structures wherein the first and second latch structures are positioned adjacent the respective ones of the first and second mount structures.

13. The communications cable management system of claim 1 wherein the support structure includes a communications back panel assembly.

14. The communications cable management system of claim 13 wherein the support structure includes a terminal block panel assembly defining a trough adapted to receive communications cables and including mounting structures configured to support communications connecting blocks.

15. The communications cable management system of claim 13 wherein the support structure includes a spacer bracket assembly configured to be mounted between a pair of terminal block panel assemblies.

16. The communications cable management system of claim 1 wherein the support structure includes a pair of spaced apart communications racks.

17. A door assembly for a communications cable management system including a support structure defining a cable and including at least two first mount structures and at least two second mount structures spaced apart from the at least two first mount structures, the door assembly comprising:
a door body having first and second opposed side edges;
a first latch mechanism including at least two first latch structures each selectively positionable between a latched position, wherein the first latch structure engages a respective one of the first mount structures to secure the door body to the support structure for pivotal movement therebetween about a first pivot axis proximate the first side edge of the door body, and an unlatched position, wherein the first latch structure is disengaged from the first mount structure to permit the first side edge of the door to be separated from the support structure;
a second latch mechanism including at least two second latch structures each selectively positionable between a latched position, wherein the second latch structure engages a respective one of the second mount structures to secure the door body to the support structure for pivotal movement therebetween about a second pivot axis proximate the second side edge of the door body, and an unlatched position, wherein the second latch structure is disengaged from the second mount structure to permit the second side edge of the door to be separated from the support structure;
a first actuator operable by a user to selectively move each of the first latch structures as a group from their latched positions to their unlatched positions; and
a second actuator operable by a user to selectively move each of the second latch structures as a group from their latched positions to their unlatched positions;
wherein:
when the first and second latch structures are in their latched positions, the door body is secured in a closed position on the support structure;
when the first and second latch structures are in their unlatched positions, the door body can be removed from the support structure;
when the first latch structures are in their latched positions and the second latch structures are in their unlatched positions, the door body can be pivoted open about the first pivot axis; and
when the second latch structures are in their latched positions and the first latch structures are in their unlatched positions, the door body can be pivoted open about the second pivot axis.

18. A communications cable management system comprising:
a support structure defining a cable trough and including a first mount structure and a second mount structure spaced apart from the first mount structure, the first and second mount structures defining first and second pin slots, respectively; and
a door assembly including:
a door body having first and second opposed side edges;
a first latch pin selectively positionable between a latched position, wherein the first latch pin engages the first pin slot to secure the door body to the support structure for pivotal movement therebetween about a first pivot axis proximate the first side edge of the door body, and an unlatched position, wherein the first latch pin is disengaged from the first pin slot to permit the first side edge of the door to be separated from the support structure;
a second latch pin selectively positionable between a latched position, wherein the second latch pin engages the second pin slot to secure the door body to the support structure for pivotal movement therebetween about a second pivot axis proximate the second side edge of the door body, and an unlatched position, wherein the second latch pin is disengaged from the second pin slot to permit the second side edge of the door to be separated from the support structure; and at least one actuator operable to:
selectively slide the first latch pin from its latched position to its unlatched position along a first slide axis that is substantially parallel to the first pivot axis; and
selectively slide the second latch pin from its latched position to its unlatched position along a second slide axis that is substantially parallel to the second pivot axis.

19. The communications cable management system of claim 18 wherein the first and second slide axes extend substantially vertically.

20. A communications cable management system comprising:

a support structure defining a cable trough and including a first mount structure and a second mount structure spaced apart from the first mount structure; and a door assembly including:
a door body having first and second opposed side edges;
a first latch mechanism including a first latch structure selectively positionable between a latched position, wherein the first latch structure engages the first mount structure to secure the door body to the support structure for pivotal movement therebetween about a first pivot axis proximate the first side edge of the door body, and an unlatched position, wherein the first latch structure is disengaged from the first mount structure to permit the first side edge of the door to be separated from the support structure;
a second latch mechanism including a second latch structure selectively positionable between a latched position, wherein the second latch structures engages the second mount structure to secure the door body to the support structure for pivotal movement therebetween about a second pivot axis proximate the second side edge of the door body, and an unlatched position, wherein the second latch structure is disengaged from the second mount structure to permit the second side edge of the door to be separated from the support structure;

at least one actuator operable by a user to selectively move the first and second latch structures from their latched positions to their unlatched positions; and an automatic retention mechanism adapted to automatically hold the first latch structure in its unlatched position when the at least one actuator is operated to move the first latch structure from its latched position to its unlatched position and the first side edge of the door body is separated from the support structure.

21. The communications cable management system of claim 20 including a second automatic retention mechanism adapted to automatically hold the second latch structure in its unlatched position when the at least one actuator is operated to move the second latch structure from its latched position to its unlatched position and the second side edge the door body is separated from the support structure.

22. The communications cable management system of claim 20 including an automatic release mechanism adapted to automatically return the first latch structure to its latched position when the door assembly is returned to a closed position while the first latch structure is being held in its unlatched position by the automatic retention mechanism.

* * * * *